US008159255B2

(12) United States Patent
Laisne et al.

(10) Patent No.: US 8,159,255 B2
(45) Date of Patent: Apr. 17, 2012

(54) METHODOLOGIES AND TOOL SET FOR $I_{DDQ}$ VERIFICATION, DEBUGGING AND FAILURE DIAGNOSIS

(75) Inventors: Michael Laisne, Encinitas, CA (US); Songlin Zuo, San Diego, CA (US); Hailong Cui, San Diego, CA (US); Xiangdong Pan, San Diego, CA (US); Triphuong Nguyen, Escondido, CA (US)

(73) Assignee: QUALCOMM, Incorporated, San Diego, CA (US)

( * ) Notice: Subject to any disclaimer, the term of this patent is extended or adjusted under 35 U.S.C. 154(b) by 326 days.

(21) Appl. No.: 12/032,492

(22) Filed: Feb. 15, 2008

(65) Prior Publication Data

US 2009/0206868 A1 Aug. 20, 2009

(51) Int. Cl.
*G01R 31/26* (2006.01)

(52) U.S. Cl. ....... 324/762.01; 702/57; 702/58; 702/117; 702/64

(58) Field of Classification Search .................. 702/118, 702/189, 127, 109; 324/754–765
See application file for complete search history.

(56) References Cited

U.S. PATENT DOCUMENTS

| | | | | | |
|---|---|---|---|---|---|
| 5,670,892 | A | * | 9/1997 | Sporck | 324/765 |
| 5,844,909 | A | * | 12/1998 | Wakui | 714/704 |
| 5,939,894 | A | * | 8/1999 | Yamauchi et al. | 324/765 |
| 5,944,847 | A | * | 8/1999 | Sanada | 714/741 |
| 6,098,187 | A | * | 8/2000 | Takahashi | 714/741 |
| 6,140,832 | A | * | 10/2000 | Vu et al. | 324/759.01 |
| 6,212,655 | B1 | * | 4/2001 | Ghanta et al. | 714/724 |
| 6,522,159 | B1 | * | 2/2003 | Nishide | 324/765 |
| 6,751,768 | B2 | * | 6/2004 | Muradali et al. | 714/738 |
| 6,891,363 | B2 | * | 5/2005 | Desplats et al. | 324/762.09 |
| 6,894,503 | B2 | * | 5/2005 | Shi et al. | 324/537 |
| 6,941,235 | B2 | * | 9/2005 | Gattiker | 702/64 |
| 7,382,141 | B2 | * | 6/2008 | Cirkel et al. | 324/754 |
| 7,426,442 | B2 | * | 9/2008 | Gallagher | 702/32 |

(Continued)

FOREIGN PATENT DOCUMENTS

WO WO2007111288 A1 10/2007

OTHER PUBLICATIONS

T.W. Williams, et al. Iddq Testing for High Performance CMOS—The Next Ten Years. pp. 578-283. 1996 IEEE.

(Continued)

*Primary Examiner* — Richard Isla Rodas
(74) *Attorney, Agent, or Firm* — Larry J. Moskowitz; William M. Hooks

(57) ABSTRACT

Quiescent supply current ($I_{DDQ}$) verification, prediction, and debugging of low power semiconductor devices are enhanced by $I_{DDQ}$ defect diagnosis. If all $I_{DDQ}$ patterns fail verification, per module analysis is performed to sort out potential module design issues or cell constraint issues. For issues of missing constraints, and cell design or implementation issues leading to extra leakage that could be avoided by adding constraints, there are usually $I_{DDQ}$ patterns that correlate with expectations, and patterns that do not, due to the random nature of unconstrained scan cell values as determined by the pattern generation tool. Differentiating good and bad $I_{DDQ}$ patterns can identify root causes of $I_{DDQ}$ issues and additional constraints to fix the bad $I_{DDQ}$ vectors. These verification procedures are achieving $I_{DDQ}$ test success and short time to market, as well as significantly faster time to volume and improved yields because of having a higher quality and better-controlled $I_{DDQ}$ test.

75 Claims, 18 Drawing Sheets

U.S. PATENT DOCUMENTS

| | | | | |
|---|---|---|---|---|
| 7,446,550 | B2* | 11/2008 | McDowell et al. | 324/750.3 |
| 2006/0250152 | A1* | 11/2006 | Rius Vazquez et al. | 324/765 |
| 2006/0267577 | A1* | 11/2006 | Erez et al. | 324/158.1 |
| 2009/0019327 | A1* | 1/2009 | Wen et al. | 714/726 |

OTHER PUBLICATIONS

Sagar S. Sabade, et al. Test: Will It Survive the DSM Challenge? pp. 8-16. 2002 IEEE.

Guenter Weinberger. The New Millennium: Wireless Technologies for a Truly Mobile Society. 2000 IEEE.

Ralf Kakerow. Low Power Design Methodologies for Mobile Communication. 2002 IEEE.

Dongwoo Lee, et al. Static Leakage Reduction Through Simultaneous Vt/Tox and State Assignment. pp. 1014-1029. Jul. 2005 IEEE.

Teresa H. Meng. Low-Power Wireless Video Systems. pp. 130-136. Jun. 1998 IEEE.

Yuh-Fang Tsai, et al. Impact of process scaling on the efficacy of leakage reduction schemes. pp. 3-11. 2004 IEEE.

Chih-Wen Lu, et al. Is IDDQ Testing not Applicable for Deep Submicron VLSI in Year 2011? pp. 338-343. 2000 IEEE.

International Technology Roadmap for Semiconductors. Test and Test Equipment. 2003 Edition.

C. Thibeault. Improving Delat-IDDQ-based test methods. pp. 207-216. 2000 IEEE.

Peter Maxwell, et al. Current Ratios: A Self-Scaling Technique for Production IDDQ Testing. pp. 1148-1156. 2000 IEEE.

T. Aruna Unni, et al. Model-Based IDDQ Pass/Fail Limit Setting. Last accessed Feb. 14, 2008.

C. Thibeault. Increasing current testing resolution. Last accessed Feb. 14, 2008.

Anne E. Gattiker, et al. Current Signatures: Application. pp. 156-165. 1997 IEEE.

Robert C. Aitken. A Comparison of Defect Models for Fault Location with Iddq Measurements. pp. 778-787. 1992 IEEE.

International Search Report and Written Opinion—PCT/US09/034116, International Searching Authority—European Patent Office, May 19, 2009.

Yukiya, et al., "Circuit design for built-in current testing" Proceedings of the International Test Conference. Baltimore. Sep. 20, 1992, New York, IEEE, US, vol. Conf. 23, pp. 873-881, XP000356639.

* cited by examiner

METHODOLOGIES AND TOOL SET FOR $I_{DDQ}$ VERIFICATION, DEBUGGING AND FAILURE DIAGNOSIS

FIELD OF INVENTION

The present description pertains to testing of integrated circuits and pertains particularly to diagnosing defects using quiescent current tests for large-scale integrated circuits.

BACKGROUND

Quiescent supply current ($I_{DDQ}$) testing is a very effective test method for Complementary Metal-Oxide Semiconductor (CMOS) circuits. However, $I_{DDQ}$ vector verification and debugging may take considerable time and effort. Various problems have been encountered in such troubleshooting processes, so different tools and methodologies have been devised to address them. For pre-silicon $I_{DDQ}$ vector verification, a modular approach is adopted. $I_{DDQ}$ is estimated for each vector based on leakage libraries of cells, and cell constraints can be verified automatically. For post-silicon $I_{DDQ}$ vector issues, methods and analysis tools have been developed to identify the root causes. Scan cell and net value analysis will identify critical scan cells and nets, which will result in an $I_{DDQ}$ pattern either passing or failing, thus revealing the source of the extra leakage. These methodologies are proven to be successful for $I_{DDQ}$ vector debug and $I_{DDQ}$ diagnosis.

Additionally, $I_{DDQ}$ testing is a valuable test for low power CMOS circuits, since a small number of $I_{DDQ}$ vectors can achieve test effectiveness comparable to that of a much larger number of functional or other structural tests. In recent years, the technology trend of scaling down IC geometry by 40%-50% every two to three years, to achieve ever increasing performance and IC density, has resulted in a tremendous increase in the difficulty of $I_{DDQ}$ test development. According to the National Technology Roadmaps and other roadmap-related work, IC gate counts and cell leakage have been increasing. As a result, leakage current standard deviation for defect free chips has also been increasing, while defect-induced leakage has been decreasing. As a result, standard methodologies for identifying these defects such as Emission microscopy (EMMI) are either less efficient or not effective.

On the other hand, low power consumption is a key requirement for devices used in mobile applications, such as wireless communications, and this market is growing fast. Various methodologies have been devised or explored to reduce power consumption in these applications, including static leakage. Along with the physical geometries, power supply voltage is also scaling downward; this, along with various design and fabrication techniques, has helped offset the power consumption increase incurred by smaller feature size and the increasing number of transistors. Such devices are particularly suitable for $I_{DDQ}$ test; chips with around or below 1 mA of leakage can still be tested by conventional $I_{DDQ}$. In fact, $I_{DDQ}$ provides an essential means for structurally testing for leakage defects that would have catastrophic affects on the sleep time of the end product. Also, to continue utilizing $I_{DDQ}$ and taking advantage of its efficiency for testing low leakage chips, many techniques have been adopted to prolong the lifetime of $I_{DDQ}$, such as separate power regimes, delta $I_{DDQ}$, current ratio, speed-leakage correlation, power supply gating ("footer" device), power supply partitioning, etc., such that $I_{DDQ}$ can be applied to detect defect-induced leakage on the order of 10 μA when total chip $I_{DDQ}$ is ~10 mA. In $I_{DDQ}$ vector generation, verification, and debugging, various issues have been encountered, including custom cell design issues, implementation issues, constraint issues, etc. These issues also contribute to traditional debugging techniques being less effective. In addition, resolving these issues may take considerable time and effort.

SUMMARY

The following presents a simplified summary in order to provide a basic understanding of some aspects of the disclosed aspects. This summary is not an extensive overview and is intended to neither identify key or critical elements nor delineate the scope of such aspects. Its purpose is to present some concepts of the described features in a simplified form as a prelude to the more detailed description that is presented later.

In accordance with one or more aspects and corresponding disclosure thereof, various aspects are described in connection with enhancing and expediting defect diagnostics of a failure condition detected during quiescent supply current ($I_{DDQ}$) verification, prediction, and debugging. For pre-silicon verification of $I_{DDQ}$ vectors, a modular approach is adopted to process each $I_{DDQ}$ vector.

In one aspect, a method is provided for detecting defects in an integrated circuit with quiescent supply current (IDDQ) testing. A state is sensed for each of a plurality of addressable components of a low power semiconductor integrated circuit. The plurality of addressable components are tested with a plurality of vectors, at least one vector causing a quiescent supply current level defined as failing as being above a desired level defined as passing. A sample pair consists of a failing vector and a passing vector. A probe vector is iteratively formed as a combination of the failing vector and the passing vector, with additional subsets from the failing vector for a previous passing probe vector or additional subsets from the passing vector for a previous failing probe vector to converge upon a final sample pair differing by a critical bit whose state directly correlates with either a passing or failing result.

In additional aspect, at least one processor detects defects in an integrated circuit with quiescent supply current (IDDQ) testing. A first module senses a state for each of a plurality of addressable components of a low power semiconductor integrated circuit. A second module tests the plurality of addressable components with a plurality of vectors, at least one vector causing a quiescent supply current level defined as failing as being above a desired level defined as passing. A third module forms a sample pair of the failing vector and a passing vector. A fourth module iteratively forms a probe vector as a combination of the failing vector and passing vector, with additional subsets from the failing vector for a previous passing probe vector or additional subsets from the passing vector for a previous failing probe vector to converge upon a final sample pair differing by a critical bit whose state directly correlates with either a passing or failing result.

In a further aspect, a computer program product detects defects in an integrated circuit with quiescent supply current (IDDQ) testing. A first set of codes causes a computer to sense a state for each of a plurality of addressable components of a low power semiconductor integrated circuit. A second set of codes causes the computer to test the plurality of addressable components with a plurality of vectors, at least one vector causing a quiescent supply current level defined as failing as being above a desired level defined as passing. A third set of codes causes the computer to form a sample pair of the failing vector and a passing vector. A fourth set of codes causes the computer to iteratively form a probe vector as a combination of the failing vector and passing vector with additional subsets from the failing vector for a previous passing probe vector or additional subsets from the passing vector for a previous failing probe vector to converge upon a final sample pair differing by a critical bit whose state directly correlates with either a passing or failing result.

In yet an additional aspect, an apparatus detects defects in an integrated circuit with quiescent supply current (IDDQ) testing by using means for sensing a state for each of a plurality of addressable components of a low power semiconductor integrated circuit. Another means is provided for testing the plurality of addressable components with a plurality of vectors, at least one vector causing a quiescent supply current level defined as failing as being above a desired level defined as passing. An additional means is provided for forming a sample pair of a failing vector and a passing vector. Yet another means is provided for iteratively forming a probe vector as a combination of the failing vector and passing vector with additional subsets from the failing vector for a previous passing probe vector or additional subsets from the passing vector for a previous failing probe vector to converge upon a final sample pair differing by a critical bit whose state directly correlates with either a passing or failing result.

In another aspect, an apparatus is provided for detecting defects in an integrated circuit with quiescent supply current (IDDQ) testing. A virtual tester senses a state for each of a plurality of addressable components of a low power semiconductor integrated circuit and tests the plurality of addressable components with a plurality of vectors, at least one vector causing a quiescent supply current level defined as failing as being above a desired level defined as passing. An IDDQ vector analyzer forms a sample pair of the failing vector and a passing vector, and iteratively forms a probe vector as a combination of the failing vector and passing vector with additional subsets from the failing vector for a previous passing probe vector or additional subsets from the passing vector for a previous failing probe vector to converge upon a final sample pair differing by a critical bit whose state directly correlates with either a passing or failing result.

To the accomplishment of the foregoing and related ends, one or more aspects comprise the features hereinafter fully described and particularly pointed out in the claims. The following description and the annexed drawings set forth in detail certain illustrative aspects and are indicative of but a few of the various ways in which the principles of the aspects may be employed. Other advantages and novel features will become apparent from the following detailed description when considered in conjunction with the drawings and the disclosed aspects are intended to include all such aspects and their equivalents.

BRIEF DESCRIPTION OF THE DRAWINGS

The features, nature, and advantages of the present disclosure will become more apparent from the detailed description set forth below when taken in conjunction with the drawings in which like reference characters identify correspondingly throughout and wherein.

DETAILED DESCRIPTION

Figure 1:
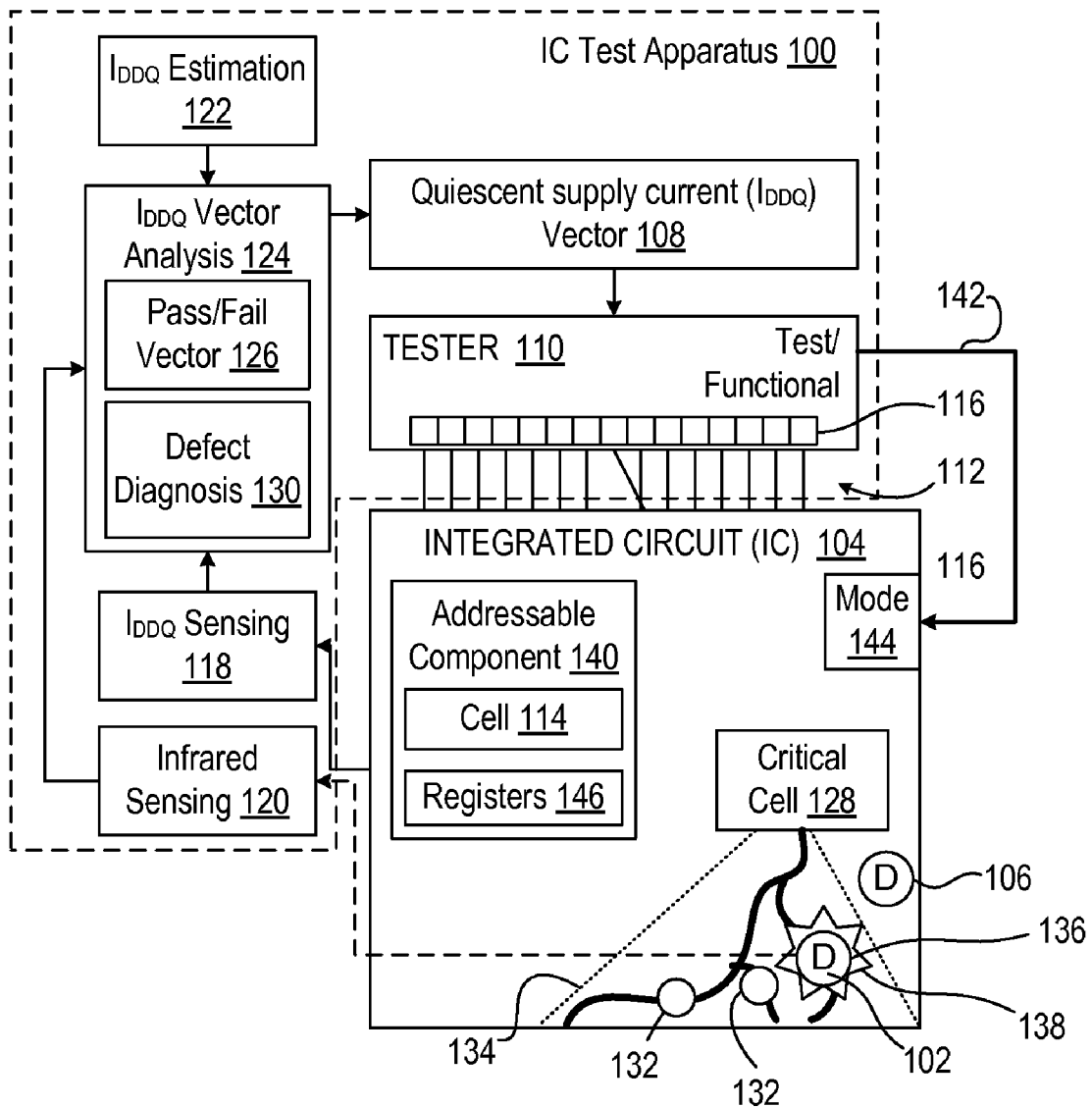
FIG. 1 illustrates a block diagram of an integrated circuit (IC) test apparatus for utilizing a quiescent supply current ($I_{DDQ}$) vector analysis (IVA) to diagnose high current defects in an IC.

Aspects disclosed herein introduce systematic procedures for $I_{DDQ}$ verification, prediction, and debugging, as well as the successful application of these procedures and expansion of $I_{DDQ}$ debugging methodology to $I_{DDQ}$ defect diagnosis. For pre-silicon verification of $I_{DDQ}$ vectors, a modular approach is adopted to process each $I_{DDQ}$ vector. Vectors are simulated on a virtual tester (VT) to determine chip status, which is analyzed in combination with design net lists to extract the status of all primitive instances used in the design. $I_{DDQ}$ is then estimated for each vector based on the input status of such primitive instances, according to cell leakage libraries. Input status of all modules, particularly custom modules requiring constraints, and $I_{DDQ}$ estimates are verified to screen any possible issues. Once silicon arrives, comparisons are made among $I_{DDQ}$ estimates, $I_{DDQ}$ test data, and current consumption by functional sleep vectors, to verify all $I_{DDQ}$ vectors and establish correlation. For various post-silicon $I_{DDQ}$ vector issues, different methodologies and tools have been developed to identify the root causes. If all $I_{DDQ}$ patterns fail verification, per module analysis is performed to sort out potential module design issues or cell constraint issues. For issues of missing constraints, and cell design or implementation issues leading to extra leakage that could be avoided by adding constraints, there are usually $I_{DDQ}$ patterns that correlate with expectations, and patterns that do not, due to the random nature of unconstrained scan cell values as determined by the pattern generation tool. In such cases, an aspect disclosed herein presents a method for differentiating good and bad $I_{DDQ}$ patterns in order to identify root causes of $I_{DDQ}$ issues and additional constraints to fix the bad $I_{DDQ}$ vectors. These verification procedures have been applied to, and optimized in real chip tests, and have been proven to be very successful in saving $I_{DDQ}$ verification and debug time and effort, and are a key factor in achieving $I_{DDQ}$ test success and short time to market. Additionally, the verification process results in significantly faster time to volume and improved yields as a result of having a higher quality and better-controlled $I_{DDQ}$ test.

Various aspects are now described with reference to the drawings. In the following description, for purposes of explanation, numerous specific details are set forth in order to provide a thorough understanding of one or more aspects. It may be evident, however, that the various aspects may be practiced without these specific details. In other instances, well-known structures and devices are shown in block diagram form in order to facilitate describing these aspects.

As used in this application, the terms "component", "module", "system", and the like are intended to refer to a computer-related entity, either hardware, a combination of hardware and software, software, or software in execution. For example, a component may be, but is not limited to being, a process running on a processor, a processor, an object, an executable, a thread of execution, a program, or a computer. By way of illustration, both an application running on a server and the server can be a component. One or more components may reside within a process or thread of execution and a component may be localized on one computer or distributed between two or more computers.

The word "exemplary" is used herein to mean serving as an example, instance, or illustration. Any aspect or design described herein as "exemplary" is not necessarily to be construed as preferred or advantageous over other aspects or designs.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. In addition, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

Various aspects will be presented in terms of systems that may include a number of components, modules, and the like. It is to be understood and appreciated that the various systems may include additional components, modules, etc. or may not include all of the components, modules, etc. discussed in connection with the figures. A combination of these approaches may also be used. The various aspects disclosed herein can be performed on electrical devices including devices that utilize touch screen display technologies or mouse-and-keyboard type interfaces. Examples of such devices include computers (desktop and mobile), smart phones, personal digital assistants (PDAs), and other electronic devices both wired and wireless.

In FIG. 1, an integrated circuit (IC) test apparatus 100 enables expeditious diagnostics of defects 102 in an IC 104 under test by using $I_{DDQ}$ testing. $I_{DDQ}$ testing is a method for testing CMOS integrated circuits for the presence of manufacturing faults. It relies on measuring the supply current ($I_{DD}$) in the quiescent state (when the circuit is not switching). The current consumed in the state is commonly called $I_{DDQ}$ for $I_{DD}$ (quiescent) and hence the name. $I_{DDQ}$ testing uses the principle that in a correctly operating quiescent CMOS digital circuit, there is no static current path between the power supply and ground, except for a small amount of leakage. Many common semiconductor-manufacturing faults will cause the current to increase by orders of magnitude, which can be easily detected. This has the advantage of checking the chip for many possible faults with one measurement. Another advantage is that it may catch faults that are not found by conventional stuck-at fault test vectors. IDDQ testing is somewhat more complex than just measuring the supply current. If a line is shorted to $V_{DD}$, for example, it will still draw no extra current if the gate driving the signal is attempting to set it to '1'. However, a different vector set that attempts to set the signal to '0' will show a large increase in quiescent current, signaling a bad part. $I_{DDQ}$ testing has many advantages, such as being able to identify physical defects. $I_{DDQ}$ testing catches some defects that other tests, particularly stuck-at logic tests, do not. In addition, IDDQ testing tends to be extremely cost effective and expeditious.

It should be appreciated that a binary vector is described herein as an illustrative implementation for clarity; however, aspects consistent with the present disclosure can be implemented in other base forms.

However, although $I_{DDQ}$ testing can quickly detects flaws, often a significant number of production ICs 104 have insignificant defects 106 that would not limit their usefulness to a particular application. The defect 106 may not be significant with regard to portions of large-scale circuitry that are actually utilized. Thus, a small chance of a manufacturing defect can result in expense in scrapping of usable ICs 104. In addition, merely detecting that a failure exists can fall short of providing sufficient information to actually track down a physical location on the IC 104, which can be a significant issue if the defect 102 is a systemic design flaw that must be corrected.

To address these deficiencies, different tools and methodologies have been developed to address $I_{DDQ}$ verification and debugging issues encountered at different stages of $I_{DDQ}$ test. A modular, statistical approach is adopted for pre-silicon $I_{DDQ}$ verification and estimation. Because constraint information is embedded in leakage library files, $I_{DDQ}$ vector verification can be automated. After arrival of silicon, statistical scan value analysis and binary search for critical bits are used for $I_{DDQ}$ vector debugging; this methodology has been proven very successful for $I_{DDQ}$ vector debugging and $I_{DDQ}$ failure diagnosis. Such diagnosis approach is defect oriented and fault-model independent. In practice, the $I_{DDQ}$ failure diagnosis approach has been shown to converge quickly with excellent resolution and accuracy.

In particular, an $I_{DDQ}$ vector component 108 generates a plurality of vectors selected so that a tester 110 connected to IC pins 112 can exercise a plurality of cells 114 of the IC 104 utilizing one of a plurality of binary vectors 116. An $I_{DDQ}$ sensor 118 detects the total leakage current while an infrared (IR) sensor 120 detects a heat signature of the IC 104. An $I_{DDQ}$ estimator 122 utilizes a library model of the IC 104 to verify the $I_{DDQ}$ test results of the selected vectors. An $I_{DDQ}$ vector analyzer (IVA) 124 determines passing and failing vectors, in particular combines portions of passing and failing vectors in a component 126 in order to determine a critical bit corresponding to a critical cell 128. The IVA 124 advantageously employs a defect diagnosis component 130 that combines portions of a passing vector and a failing vector to converge upon such vectors 116 differing by only one critical bit. With the identification of the critical bit, these two vectors can be simulated to find nets 132 in a forward cone 134 of the critical scan bit. Diagnosis then looks for a critical net 136 that toggles in value corresponding to the critical bit. With identification of the critical net 136, the location of the defect 102 can be determined. In an illustrative implementation, a physical location of the defect 102 indicated by a hot spot 138 sensed by the IR sensor 120 determined to toggle with the critical bit can also be correlated to enhance diagnostics.

In the illustrative implementation, the cells 114 are one example of addressable components 140 made separately accessible by the tester 110. In particular, the tester 110 signals for test mode as depicted at 142 to a mode selection component 144 of the IC 104. Addressable components 140 can also include elements, depicted as registers 146 that are separately addressable in a default or selected functional mode for the IC 104. It should be appreciated that levels deemed to be passing or failing can be arbitrarily determined based upon estimates, based upon benchmarks for comparable ICs 104, and/or relatively higher levels found for some readings as compared to other readings.

Figure 2:
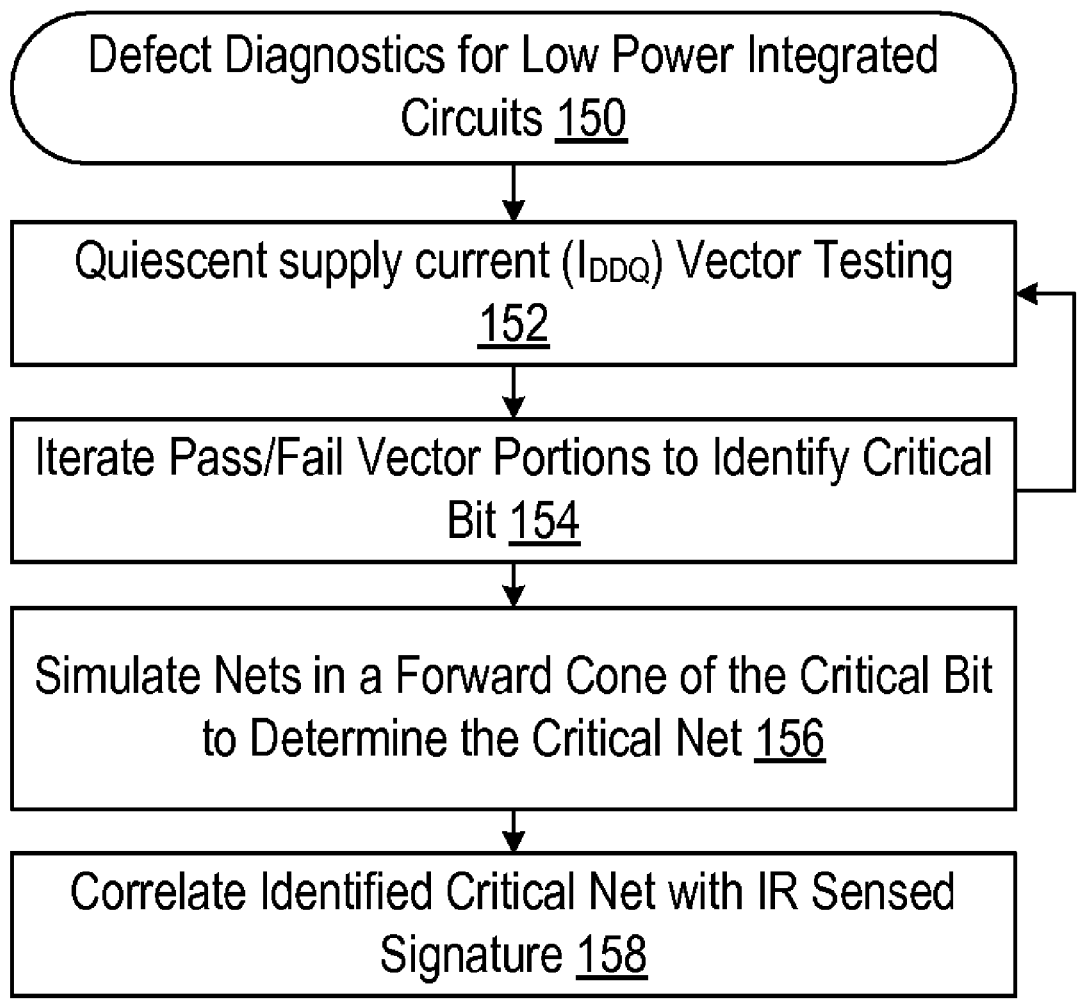
FIG. 2 illustrates a flow diagram of a methodology for $I_{DDQ}$ vector analysis (IVA) for diagnosing high current defects in an IC.

In FIG. 2, a methodology 150 for defect diagnostics for lower power integrated circuits utilizes quiescent supply current $I_{DDQ}$ vector testing (block 152). In response to detecting a failing vector, portions of the passing and failing vectors are combined for further $I_{DDQ}$ vector testing to converge upon a critical bit (block 154). This diagnosis utilizes design details of a forward cone activated by this critical bit to identify a critical net that is the source of the defect (block 156). Advantageously, a sensed IR signature that toggles in correspondence to this critical bit can confirm a physical location of the diagnosed critical net (block 158).

Figure 3:
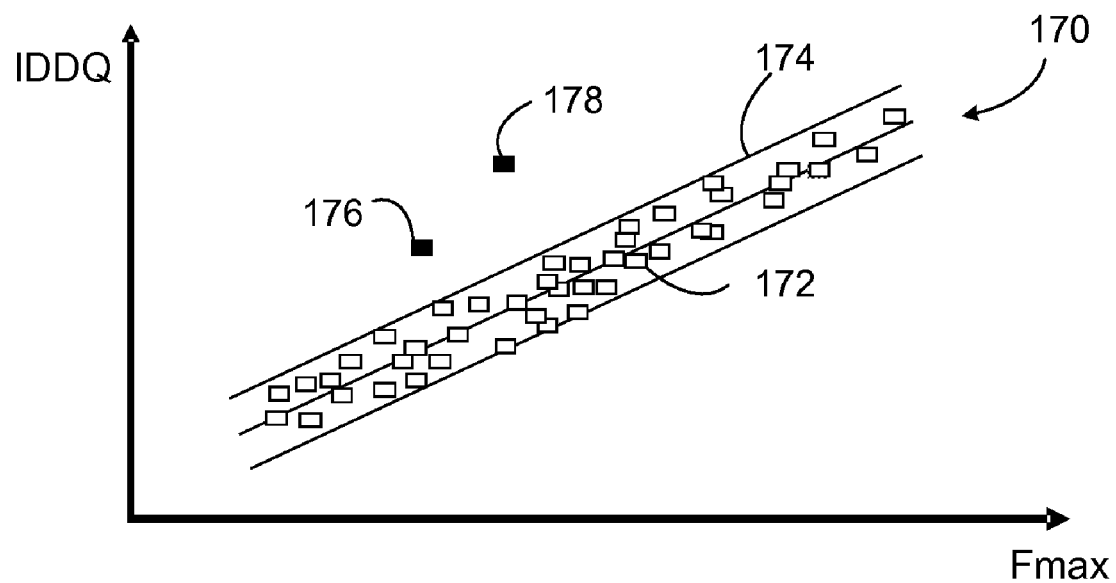
FIG. 3 illustrates a plot of maximum operating frequency ($F_{MAX}$) versus $I_{DDQ}$ for IVA results having two vector outliers.

In FIG. 3, a depiction 170 of plotting of maximum operating frequency ($F_{MAX}$) versus $I_{DDQ}$ obtained through vector analysis showing a plurality of readings 172 that trends closely to trend line 174 with two outlying readings 176, 178 of higher $I_{DDQ}$. It should be appreciated that with the benefit of the present disclosure that diagnosing the cause of these outlying readings 176, 178 can be difficult and time consuming.

Figure 4:
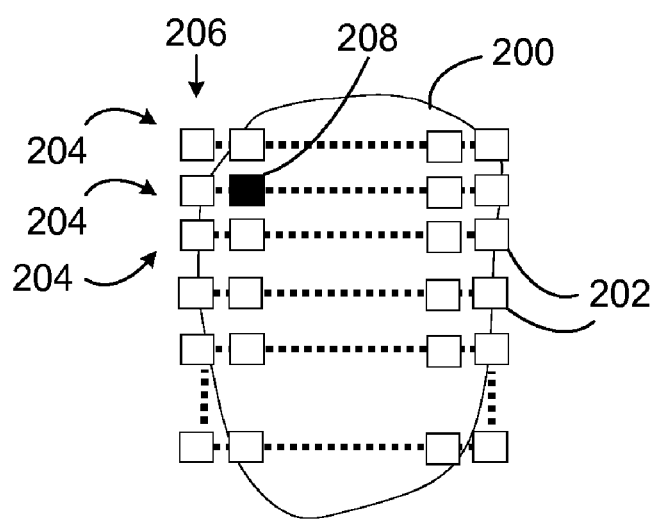
FIG. 4 illustrates a diagram of a plurality of scan cells activated by a vector, each scan cell being part of an isolated chain of cells when in test mode.

In FIG. 4, an integrated circuit (IC) 200 is configured in test mode, which configures circuitry components 202 into a plurality of separated chains 204, each chain activated or not by one bit of a test vector 206. One defective component 208 is depicted in the second chain 204.

Figure 5:
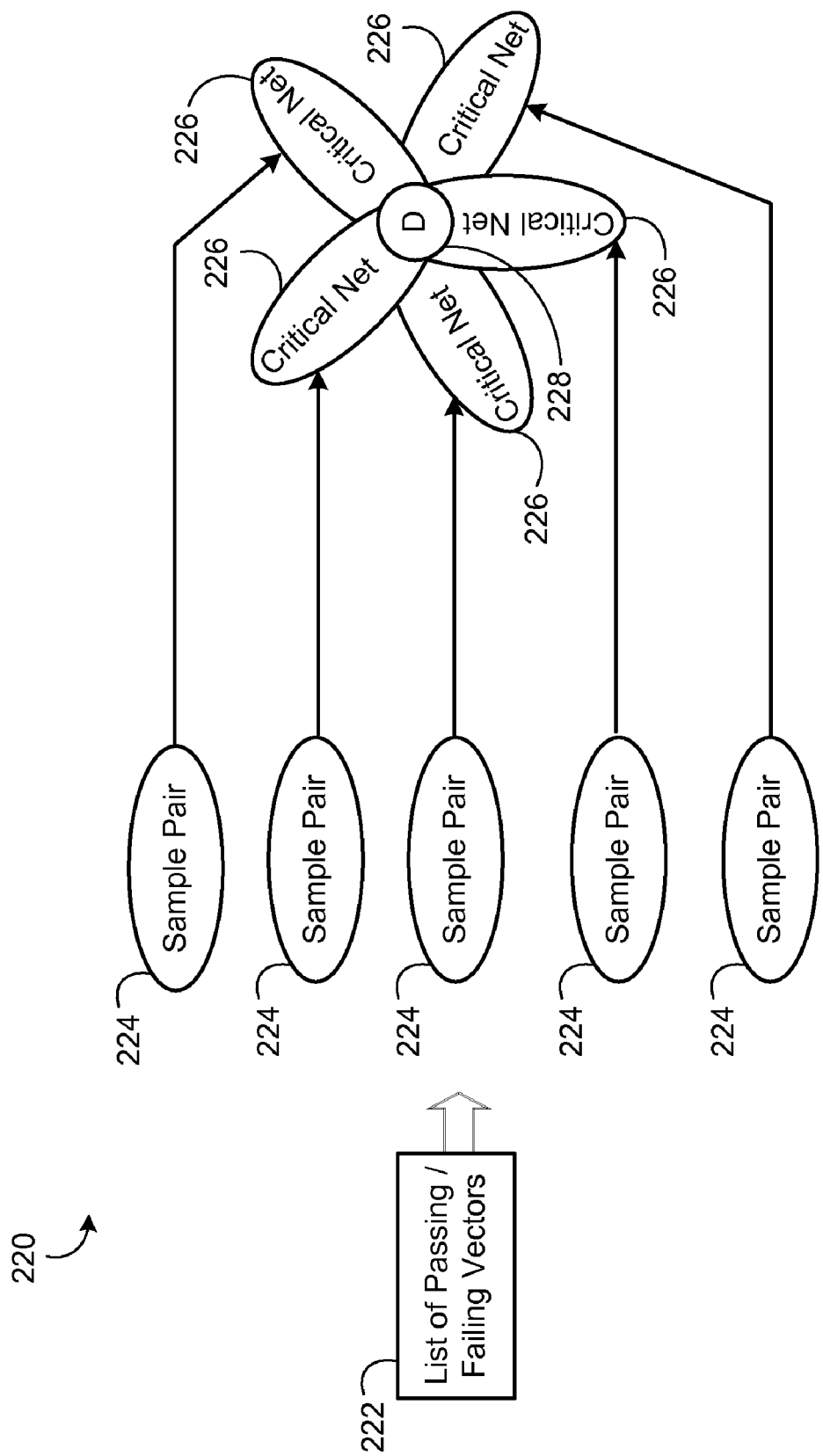
FIG. 5 illustrates a block diagram of a diagnostic methodology for converging upon a single critical net or set of critical nets responsible for a change in $I_{DDQ}$.

In FIG. 5, a diagnostic methodology 220 reduces the time to locate a defect about in half in practice for large scale integrated circuits (i.e., approximately one million components) over conventional $I_{DDQ}$ testing that ends with identification of a list of passing/failing vectors (block 222). In particular, a plurality of sample pairs 224 of failing and passing vectors are evaluated for their respectively identified critical nets 226 until a critical bit is identified as an intersection, depicted as "D" for defect at 228. The number of sample pairs 224 sufficient for such elimination can vary, such as 5, 10 or 20. It should be appreciated with the benefit of the present disclosure that a brute force iteration through possible vectors to achieve this result otherwise would require going through a substantial portion of possible scan cell vectors (e.g., half a million).

Figure 6:
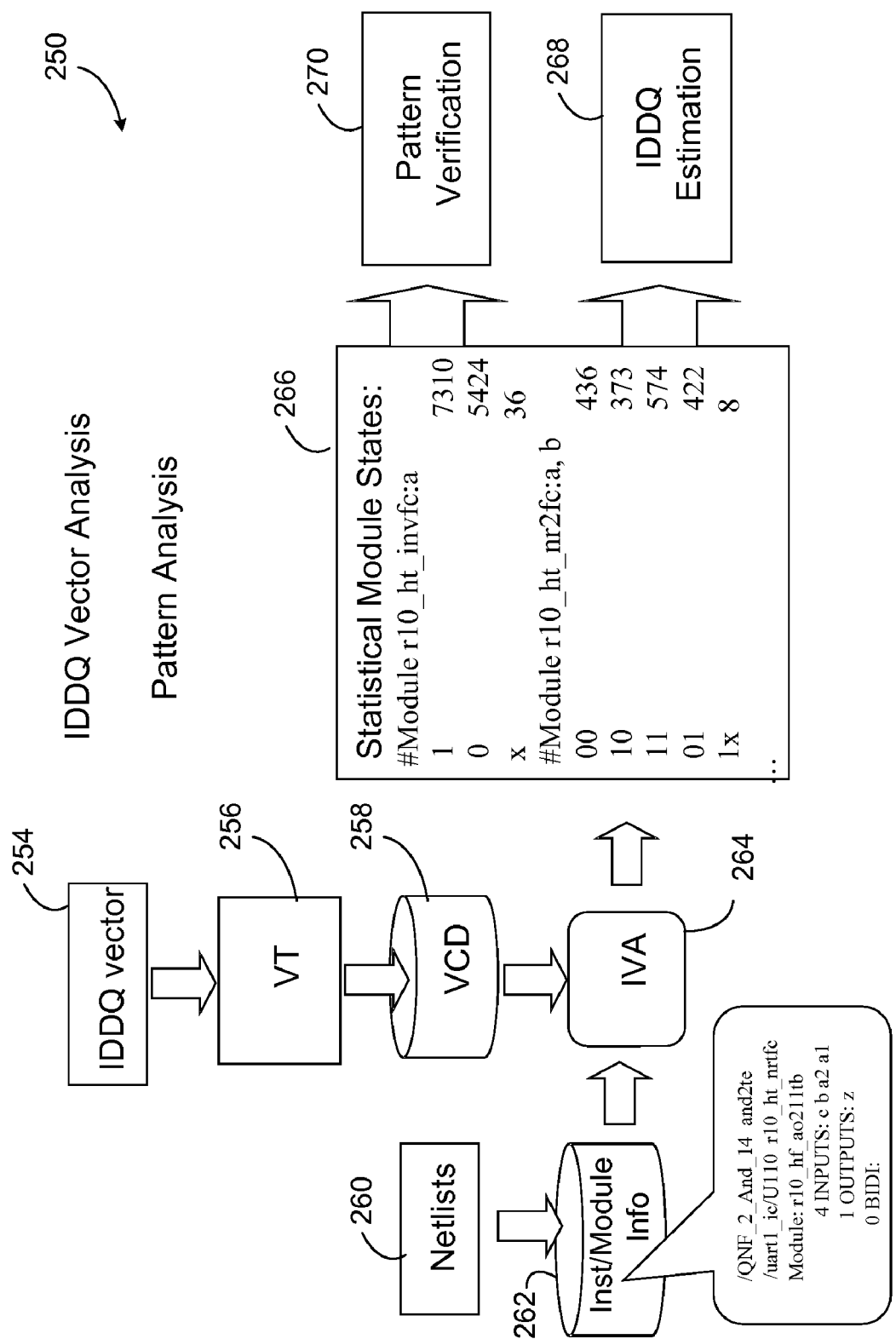
FIG. 6 illustrates a flow diagram of a methodology for and an example of $I_{DDQ}$ vector analysis resulting in pattern verification and $I_{DDQ}$ estimation.

Pre-Silicon $I_{DDQ}$ Verification and Estimation. Referring to FIG. 6, in one aspect, an $I_{DDQ}$ vector analysis methodology 250 for pattern analysis is depicted. It is beneficial for $I_{DDQ}$ verification is to catch as many issues as possible prior to silicon arrival. The earlier potential issues are caught, the lower the diagnostic and symptomatic costs for first silicon bring-up, test development, and yield improvement. To achieve this, a tool flow, $I_{DDQ}$ Vector Analysis (IVA) 252 has been developed. In this flow 250, as shown in FIG. 6, $I_{DDQ}$ vectors 254 are first simulated on a virtual tester (VT) 256 to determine the state of each node in the IC at the end of the vector 2554 when the $I_{DDQ}$ measurement is taken.

This chip status is saved into a value change dump (VCD) file 258. A design net list 260 is processed to get a list of all primitive instances with their module names, and of all modules with input and output information, depicted at 262. The VCD files 258, containing chip status as configured by specific $I_{DDQ}$ vectors 254, is processed by an IVA engine 264, in combination with design information, to break down chip status by module. A statistical list of all modules, with the number of instances of each, in specific input status, depicted at 266, is generated by the IVA engine 264. This information is then used for $I_{DDQ}$ prediction ("$I_{DDQ}$ estimation") 268 and verification ("pattern verification") 270 of the $I_{DDQ}$ vector 254.

Figure 7:
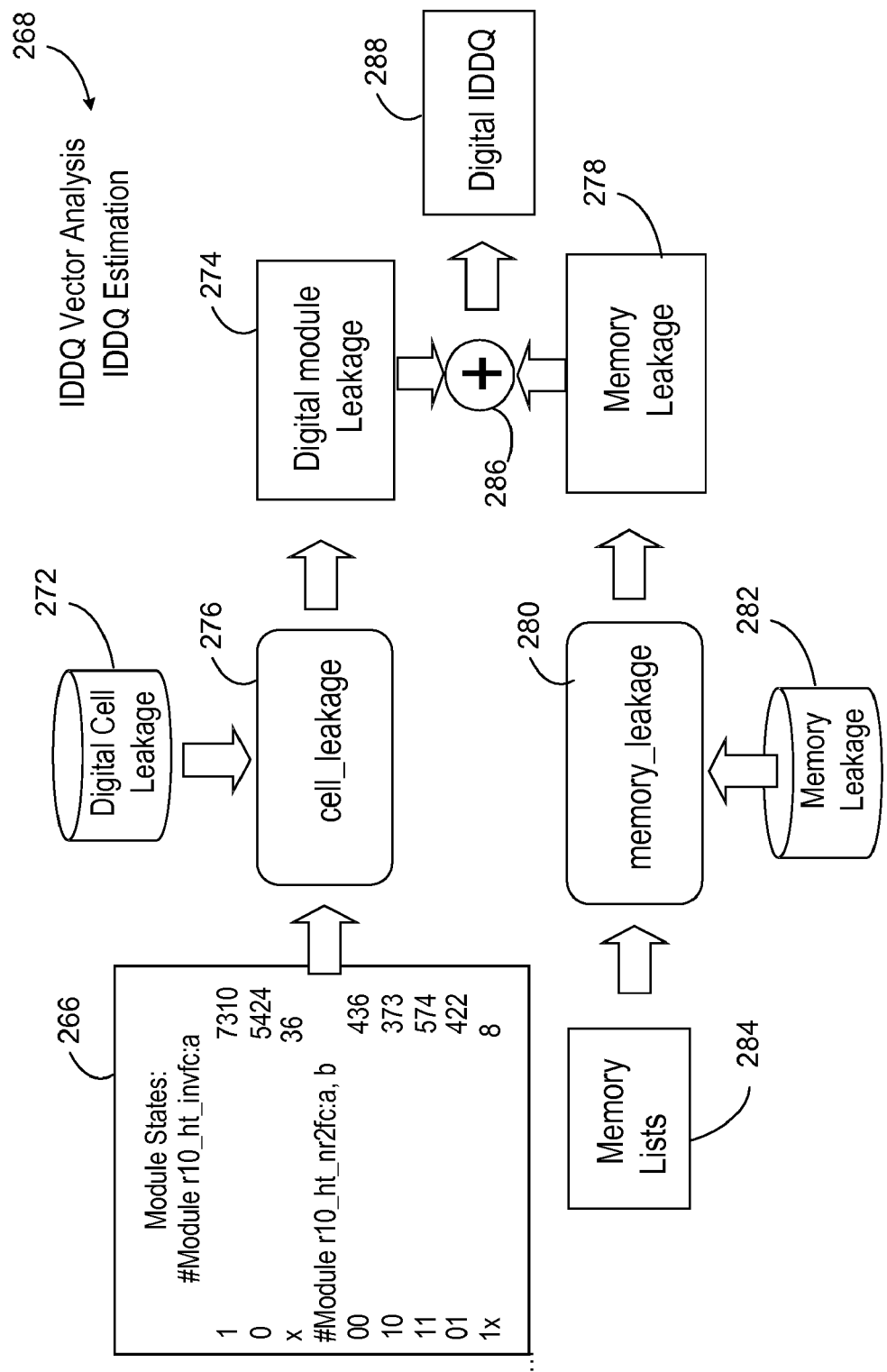
FIG. 7 illustrates a flow diagram of a methodology for and an example of $I_{DDQ}$ estimation for a digital domain containing standard cells and memories.

In FIG. 7, for $I_{DDQ}$ estimation 268, leakage information of standard cells in a given input state can be read from digital cell leakage database 272, which are the power library files. In a given block or power domain, the total leakage of all cells (digital module leakage) 274 can be estimated by accumulating the leakage of all instances by a cell leakage component 276 to correspond to the measured module states 266. Leakage of static random access memories (SRAM) in quiescent state can be easily designed to be independent of input state with different input values such that the static leakage varies below 0.1% level. Leakage of a typical non-defective SRAM cell is also independent of data background due to the symmetry of static memory cells. In this scenario memory leakage 278 can be calculated by accumulating default leakage in a memory leakage process 280, which is from a database 282 of memory leakage corresponding to memory list 284 the IC under test, of all memory instances. Adding the leakage of memories 278 and the leakage of standard cells and other custom cells 274 in a summer 286 in the digital power domain results in an estimate of digital $I_{DDQ}$ depicted at 288.

$I_{DDQ}$ estimation also adds value to vector verification. For a cell which requires a particular set of constraints to be put into a quiescent state, its constraint information is embedded within the leakage library file; i.e., when the constraint requirements are met, its leakage is low, otherwise it is significantly higher. Therefore, like a virtual $I_{DDQ}$ test, the estimates can be examined to determine if there is any potential vector generation issue.

For verification purposes, input conditions, particularly of complex or custom cells, will be inspected on a per cell basis, to assure all cells are properly constrained to a quiescent state. With cell constraint information embedded in the leakage libraries, vector verification can be automated, i.e., abnormally high estimates indicate pattern generation issues.

A key factor affecting leakage is junction temperature. To assure an accurate estimation of $I_{DDQ}$, detailed thermal simulation was performed for a gate length of 100 nm. The power distribution resembled a real 90 nm chip with only approximately 2% of total die area consuming quiescent power, and off-channels assumed to be uniformly distributed. Under such setup, corresponding to 1 mW of typical quiescent power of low leakage chips, channel temperature was only 0.08° C. higher than ambient. Since typical test time (~$10^0$ second) is much smaller than the thermal time constant (~$10^1$ seconds) for typical chips, during $I_{DDQ}$ test, the difference between junction and ambient temperature can be safely assumed to be on the order of $10^{-3}$° C. for 90 nm chips with quiescent leakage in the 1 mW region.

Post-Silicon $I_{DDQ}$ Debug. After arrival of silicon, $I_{DDQ}$ vectors, along with functional sleep vectors, are verified on the ATE. Empirical readings of $I_{DDQ}$ vectors and functional sleep vectors, measurement estimates for each $I_{DDQ}$ vector, and process information, are correlated to determine whether each $I_{DDQ}$ vector puts the chip into a quiescent state as intended. If certain $I_{DDQ}$ vectors give unstable or abnormally high readings, these vectors are investigated.

Table 1 gives an example of an $I_{DDQ}$ debugging effort performed on a specific power domain in a 60 million transistor communications device, which is manufactured in a 90 nm process ($I_{DDQ}$ values are given in an arbitrary unit). At first, $I_{DDQ}$ readings, ~50, were higher than the functional sleep vector (~30), which was in turn higher than the theoretical prediction of 18 for the $I_{DDQ}$ vectors. After fixing test setup, $I_{DDQ}$ readings were reduced to the level of functional sleep vector, ~30, but still much higher than expected. After a specific complex cell was constrained, $I_{DDQ}$ readings were reduced to ~21, approximately in line with initial estimates, as indicated at step 3. Compared to $I_{DDQ}$ vectors, the functional sleep vector gave higher readings, so its setup was inspected using IVA, and the complex cell configuration compared to its configuration in the $I_{DDQ}$ vectors. As a result, a missing constraint was found and added to a DAC cell to turn off a DC path, and eventually, its reading was reduced to the same level as $I_{DDQ}$ vectors, as indicated at step 4.

TABLE 1

Empirical $I_{DDQ}$ results from a debug session. $I_{DDQ}$ values are in arbitrary units.

| | Debug Steps | | | |
|---|---|---|---|---|
| | Step 1 | Step 2 | Step 3 | Step 4 |
| CDMA sleep fsoff vector | ~30 | ~30 | ~30 | ~21 |
| IDDQ_fsoff | ~50 | ~31 | ~21 | ~21 |

Usually root causes of $I_{DDQ}$ issues can be attributed to complex or custom cell design issues, implementation issues, missing constraints, etc. Frequently the first two types of issues will result in extra leakage that can be avoided by adding constraints before a design revision. Because of the random nature of Automatic Test Pattern Generation (ATPG) shift-in values for the unconstrained scan cells, there can be some good $I_{DDQ}$ vectors and some bad $I_{DDQ}$ vectors; when this occurs, scan value analysis can be performed to differentiate the controllability of different $I_{DDQ}$ vectors and identify the root causes of issues. So $I_{DDQ}$ debugging, from a scan test controllability point of view, mainly includes finding extra constraints to fix bad $I_{DDQ}$ vectors thus resulting in working $I_{DDQ}$ tests, and modifying the design, if needed, for the next revision: e.g., when the root causes are design related. When silicon arrives, all $I_{DDQ}$ vectors are verified on the ATE. If all $I_{DDQ}$ vectors fail the initial evaluation, it could be a design, test implementation, or incorrect constraint issue; any one of which can behave like a "passive" defect, i.e., extra leakage is always incurred independent of the specific vector configuration. It is very unlikely that the issues are "active", or vector dependent, and that all existing vectors happen to provoke the issues. When problems are found to be vector independent, general verification of $I_{DDQ}$ vectors, such as complex cell design and implementation, per module analysis of design, cross-power-domain verification, etc., is reviewed to assure all cells, particularly custom cells, are correctly designed, implemented, and configured.

If some $I_{DDQ}$ vectors fail evaluation, while others pass—typical behavior of vector-dependent issues, then it is possible to fix the bad vectors by leveraging the good ones. First, scan values of bad $I_{DDQ}$ vectors and good $I_{DDQ}$ vectors are analyzed statistically, to see if there is any collective difference in scan values between the two groups. If there are scan cells which always have the same value in all good patterns and the opposite value in all bad patterns, then it is very likely these scan cells need to be constrained to the values they have in good $I_{DDQ}$ patterns, and the chance that this is a mere coincidence for any of such scan cells is $2^{-n}$, where n is the total number of $I_{DDQ}$ patterns analyzed. If constraining scan cells this way does not fix all bad $I_{DDQ}$ vectors, or there is no collective difference in scan values between good and bad $I_{DDQ}$ patterns, then it may be impossible to get all $I_{DDQ}$ vectors working by setting individual scan cell constraints, but a further step, net constraint analysis, may be needed. In addition, a more complex method, called "binary search for critical cell(s)", or "bit flipping", was developed to deal with such situations.

For a single $I_{DDQ}$ issue, if there are good and bad vectors that give low and high readings, then the issue will be "activated" in bad vectors and cause extra leakage, and not "activated" in good vectors. For a particular pair of good and bad $I_{DDQ}$ vectors, $V_G$ and $V_B$, suppose there are total of N scan bits which are different between them; when all the N different scan bits in $V_B$ were replaced with the good ones in $V_G$—denoted by $V_B(N)$—then the bad vector should be fixed and give low reading, since $V_B(N)=V_G$. Starting from $V_B$ and replacing more and more of its scan bits according to $V_G$ produces a series of new $I_{DDQ}$ vectors: $V_B(i)$ where i=0, 1, 2, 3 ... N, and $V_B(0)=VB$ (no different scan bits replaced), $V_B(N)=V_G$ (all different scan bits replaced). As more and more scan bits are replaced in the bad vector, $V_B$, $I_{DDQ}$ readings may toggle between high and low values; such scan bits are said to be "critical". That is, if flipping a bit in any $I_{DDQ}$ vector changes the $I_{DDQ}$ reading status, from high to low or vice versa, the bit is called "critical" to that $I_{DDQ}$ vector. Therefore, we may see at least one, and possibly multiple, critical scan bit(s) while replacing different scan bits in the bad vector, $V_B$, with the values in the good one, $V_G$.

Figure 8:
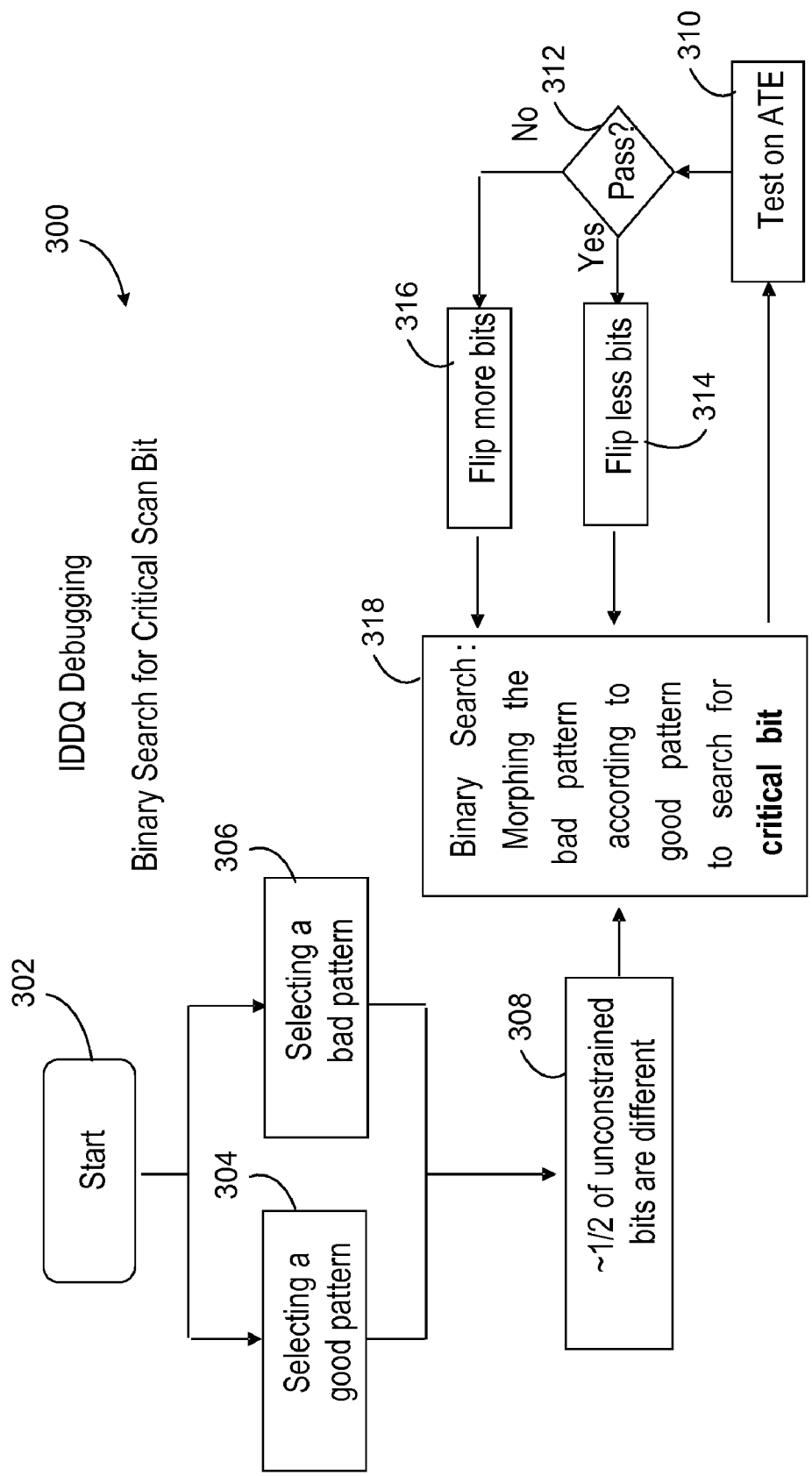
FIG. 8 illustrates a flow diagram of a methodology for $I_{DDQ}$ debugging by performing a binary search for a critical scan bit utilizing IVA with a bad pattern being defined as a pattern with higher $I_{DDQ}$ relative to a good pattern.

The procedure described below is guaranteed to converge on one critical scan bit in O(logN) time, starting with one pair of good and bad $I_{DDQ}$ vectors. A methodology 300 for $I_{DDQ}$ debugging binary search for a critical scan bit is shown in FIG. 8 beginning at block 302

The first step of the binary search for critical scan cell(s) is the selection of one pair of $I_{DDQ}$ vectors, one good and one bad, depicted at 304, 306 respectively. Given that there are N scan bits that are different between the good and the bad $I_{DDQ}$ vectors, the bad vector can be fixed by flipping all the N different scan bits, since after flipping all the N different bits, all the scan bits in the bad vector are the same as in the good one. The N scan bits in the bad $I_{DDQ}$ pattern, which are different from the good pattern, will be flipped following a sequence as in a binary search, to determine the critical bit(s). First, N/2 different scan bits are flipped in the bad pattern, depicted at 308, and tested on the ATE (block 310). If this fixes the bad pattern at 312, binary search steps back and flips N/4 bits ("flips less bits") 314, otherwise it steps forward and flips 3*N/4 bits ("flips more bits") 316. This iterating binary search depicted at 318 proceeds until one bit (the n-th bit) is reached, such that when n−1 bits are flipped, the bad pattern is still bad, but when n bits are flipped, the bad pattern becomes good. Therefore, the n-th scan cell is "critical" to the pattern with only n−1 bits flipped (or $V_B(n-1)$): assigning different values (1 or 0) to this critical scan cell will dictate whether the $I_{DDQ}$ pattern is good or not. It is possible that there is more than one $I_{DDQ}$ issue (or multiple defects), or one issue (or a single defect) corresponding to different levels of elevated $I_{DDQ}$ readings. In the case of multiple issues (defects), special attention is paid during the bit-flipping to track one issue at a time, and run different approaches to address different issues (or defects), as needed. Note that all the $I_{DDQ}$ vectors are generated with the same ATPG flow and the same JTAG configuration. Also, note that all sequential operations need to be modeled in simulation. Under these conditions the methodology is not limited to scan shift-in values, for example Primary Inputs may also be included in the analysis; this makes the technique particularly suitable for defect diagnosis at the foundry in a fabless design house model where protection of IP is paramount.

Figure 9A:
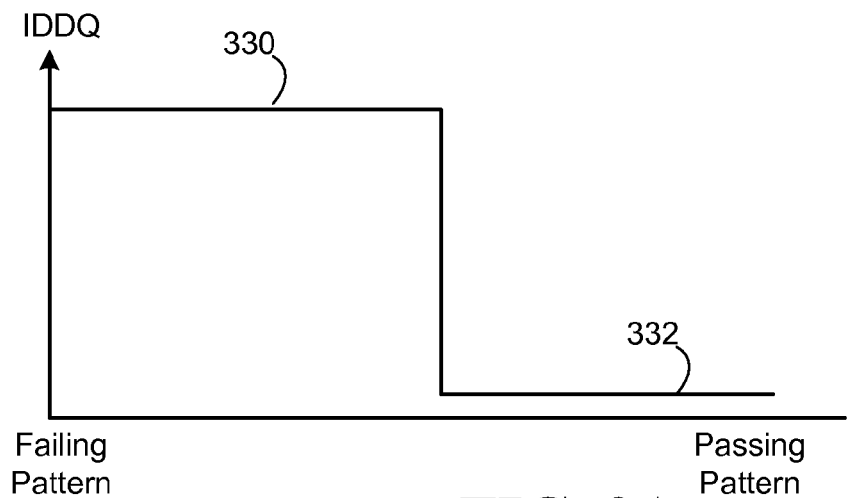
FIGS. 9A-C illustrate a sequence of schematic diagrams of binary search results for $I_{DDQ}$ critical bit(s) with FIG. 9A being a single issue, FIG. 9B being multiple issues, and FIG. 9C being a single issue or multiple issues resulting in multiple levels of elevated $I_{DDQ}$.
Figure 9B:
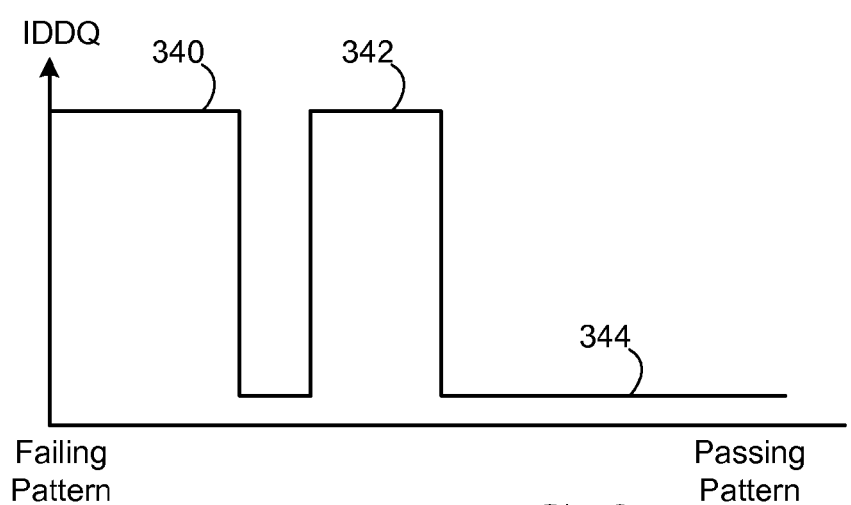
Figure 9C:
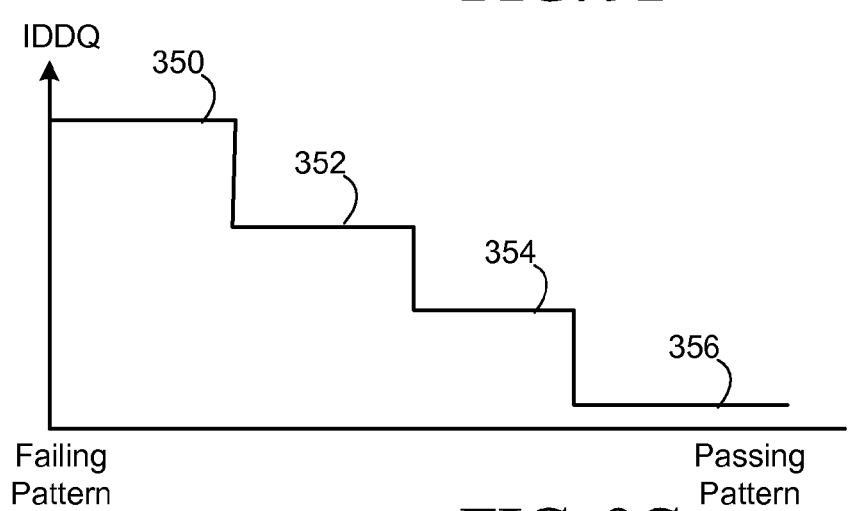
Figure 10:
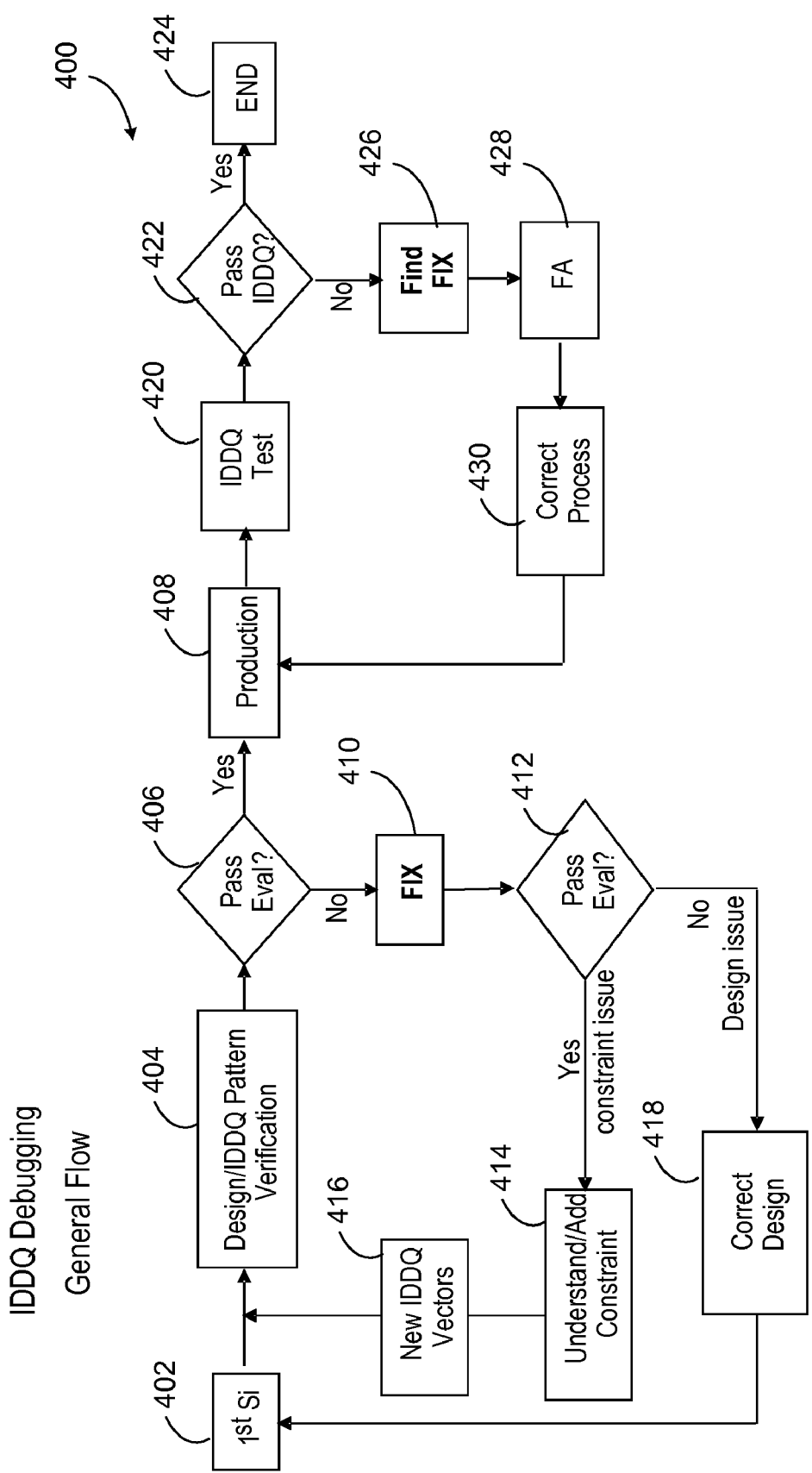
FIG. 10 illustrates a flow diagram of a general methodology for $I_{DDQ}$ debugging of a preproduction and production IC device or process.

The principle and steps of binary search for critical bit(s) associated with single and multiple $I_{DDQ}$ issues are schematically illustrated in FIG. 9A-9C. In FIG. 9A, single issue is detected at 330 of elevated $I_{DDQ}$ over a good $I_{DDQ}$ depicted at 332. In FIG. 9B, multiple issues have been detected at 340 and 342 of elevated $I_{DDQ}$ over a good $I_{DDQ}$ depicted at 344. In FIG. 9C, multiple issues or a single issue controlling multiple levels depicted at 350, 352, 354 of elevated $I_{DDQ}$ over a good $I_{DDQ}$ depicted at 356 or some combination thereof has been detected.

For a given $I_{DDQ}$ issue, the binary search process is deterministic when starting with one pair of good and bad $I_{DDQ}$ vectors. Once a critical bit is found (the n-th scan bit), along with a pair of $I_{DDQ}$ vectors, $V_B(n-1)$ and $V_B(n)$, one bad and one good, which only differ by one scan bit (the n-th bit), these two vectors are simulated using virtual tester (VT), to determine the nets with different values in the good and bad vectors, or "critical nets", to further narrow down the root cause of the issue. This process usually points to a minimal number of nets, which drive different cells, possibly including standard cells as well as complex and custom cells. Simple standard cells usually can be ruled out for $I_{DDQ}$ vector debugging, since they typically settle on quiescent states quickly during $I_{DDQ}$ testing and do not incur extra leakage; so frequently it is complex and custom cells that are associated with $I_{DDQ}$ issues. Comparing the input status of the complex/custom cell(s) in the two $I_{DDQ}$ vectors that are associated with the "critical nets", root causes of $I_{DDQ}$ issues can be identified very quickly and accurately. Once the root cause is determined, working $I_{DDQ}$ vectors can be generated with additional constraints, and if the issue is design related, the design can be modified to fix the problem.

In FIG. 1, this converging upon a particular critical net supports a complete methodology 400 for $I_{DDQ}$ issue debugging. At block 402, a first sample of a semiconductor IC (e.g., silicon) is received, which is submitted for design/$I_{DDQ}$ pattern verification (block 404). If this design passes evaluation at block 406, then the design passes to an IC production process 408. If failing in block 406, then a fix is attempted in block 410 as described above to resolve to a constraint or a defect issue. If a subsequent retesting indicates passing in block 412, then analysis is undergone to understand and to add the constraint (block 414). New IDDQ vectors are generated consistent with the constraint in block 416 and the pre-production IC is resubmitted for design/$I_{DDQ}$ pattern verification at block 404. If failing to pass evaluation back at block 412, then a design issue is ascertained and the failure information used to correct the design at block 418 with subsequent delivery of a new IC for testing at block 402.

With an acceptable design and vector constraints allowing the production IC receipt at block 408, then $I_{DDQ}$ testing at 420 is performed to monitor for manufacturing defects. If the IC tested is deemed to have passed $I_{DDQ}$ testing at block 422, then the process ends at block 424. If not passing at block 422, then an attempt is made to find a fix at block 426 guided by the convergence of the methodologies described herein. This information is passed to fault analysis at block 428 in order to then correct the manufacturing process at 430 for returning to the production process of block 408.

Figure 11:
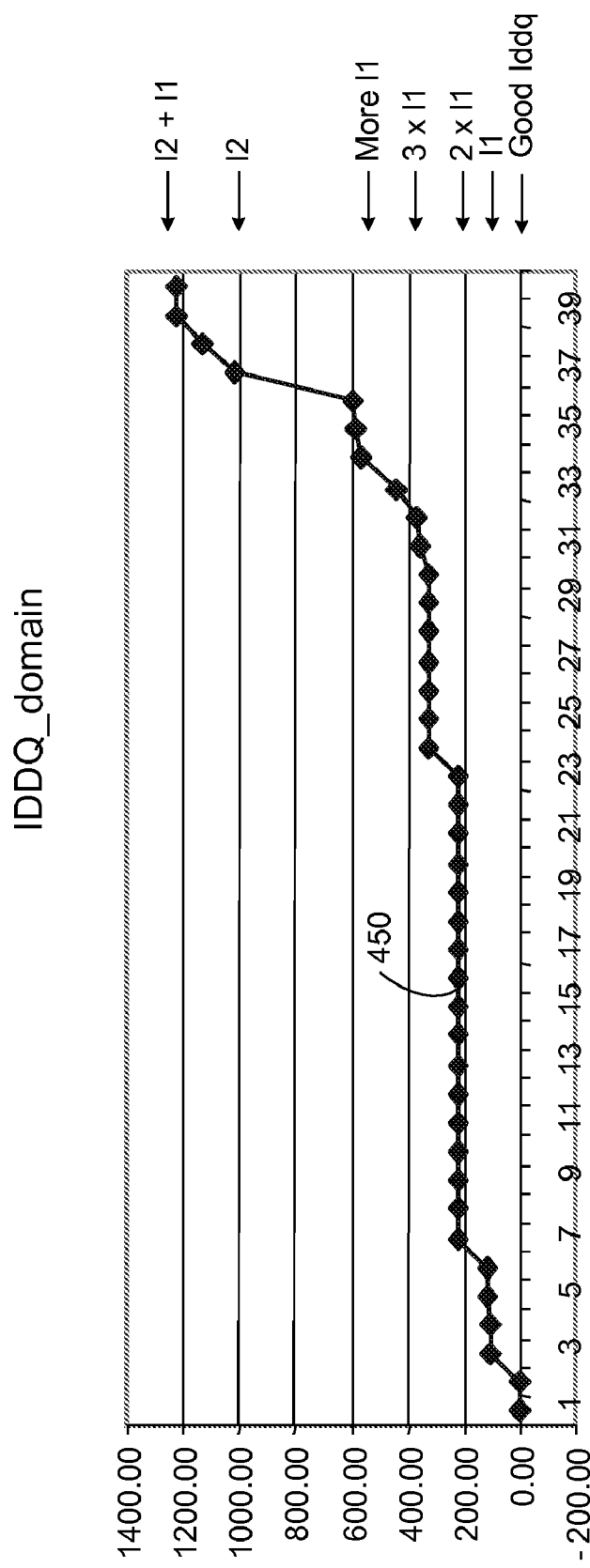
FIG. 11 illustrates a plot of $I_{DDQ}$ readings for 40 $I_{DDQ}$ vectors of a specific power domain with different levels of elevated $I_{DDQ}$ readings reflecting different $I_{DDQ}$ issues or combinations of issues.

In FIG. 11, an example plot 450 of a debugging session depicted in arbitrary units for $I_{DDQ}$ issues encountered for a different power domain in the same 60 million transistor device referred to in TABLE 1. In this case, the power domain has only a small number of cells, and the total $I_{DDQ}$ is expected to be negligible. However, the measured $I_{DDQ}$ readings for 40 vectors produced multiple steps including, ~0 (issue free), ~11, ~22, ~33, ~40+, ~60, and greater than 100, This scenario is indicative of multiple $I_{DDQ}$ issues or a combination of issues. At first, one vector from each of the ~11, ~22, ~33, and ~60 groups was chosen, along with all the vectors with $I_{DDQ}$ greater than 100 (since debugging these $I_{DDQ}$ vectors with 100+ readings was the most critical); selecting multiple failing $I_{DDQ}$ vectors was necessary in order to debug the multiple $I_{DDQ}$ issues in parallel.

A binary search for critical cell(s) was performed on each failing vector against a passing vector; the critical scan cells found and the subsequent net value analysis clearly pointed to instances of two cells: a Phase-Lock Loop (PLL) cell and a Digital-to-Analog Converter (DAC) cell. By comparing the cell input status in good and bad patterns, root causes of issues were quickly identified: a leakage of ~11 associated with a clock divider in a PLL cell and a DC path of ~100 in a DAC cell under incorrect configuration.

All the different levels of failing $I_{DDQ}$ readings observed were actually different combinations of these two issues, one or multiple clock dividers activated resulting in an $I_{DDQ}$ less than 100, or DC path in DAC cell plus possible clock divider activation for an $I_{DDQ}$ reading greater than 100.

$I_{DDQ}$ Failure Diagnosis. The same procedure has been shown to be effective when applied to $I_{DDQ}$ defect diagnosis. After all $I_{DDQ}$ vectors are verified, and a silicon device fails delta-$I_{DDQ}$, or it passes certain $I_{DDQ}$ tests, and fails others, scan and net value analysis can be applied to sort out critical net(s) to locate the defect(s). When different vectors give different readings, passing and failing, the defect(s) are excited or not excited by different vectors, or different scan-in values. By analyzing scan values (dynamic scan bit flipping), the diagnosis process will eventually end up with two vectors, with only one scan bit difference, yet giving different readings, one passing, one failing. Then these two vectors can be simulated to find the nets with opposite values (they are a subset of the nets in the forward cone of the critical scan bit), and this indicates that these nets excite the defect to cause extra leakage Furthermore, starting with different pairs of passing and failing vectors results in different sets of critical nets. The set of critical nets identified by each pair is guaranteed to be associated with the defect. By accumulating scores for different critical nets identified by different vector pairs, the diagnosis process has been found to quickly converge with excellent diagnostic resolution. This diagnostic approach is dynamic, defect-oriented, and independent of fault-models, therefore free of the issues associated with fault model selection, including incomplete coverage of a single fault model, confusion resulting from using multiple fault models, etc. In other words, this diagnostic process does not depend on the fault list. The approach of iteratively generating test vectors has been proven to be a powerful technique in many aspects of structural diagnosis.

Figure 12A:
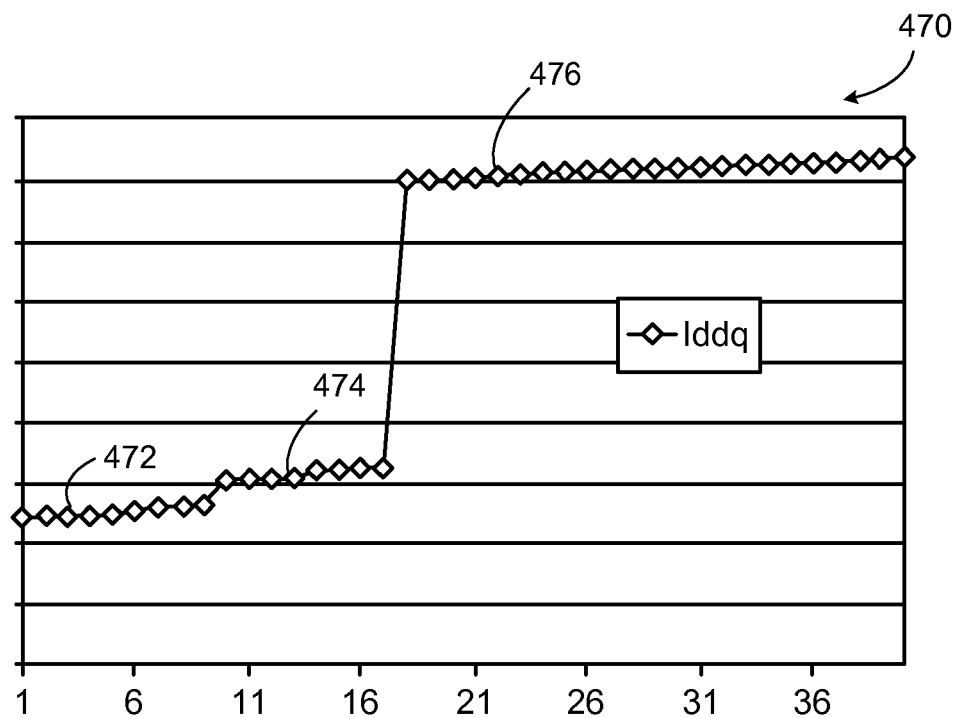
FIGS. 12A-12B illustrate a plot of $I_{DDQ}$ signatures of an illustrative Part A and Part B, respectively.
Figure 12B:
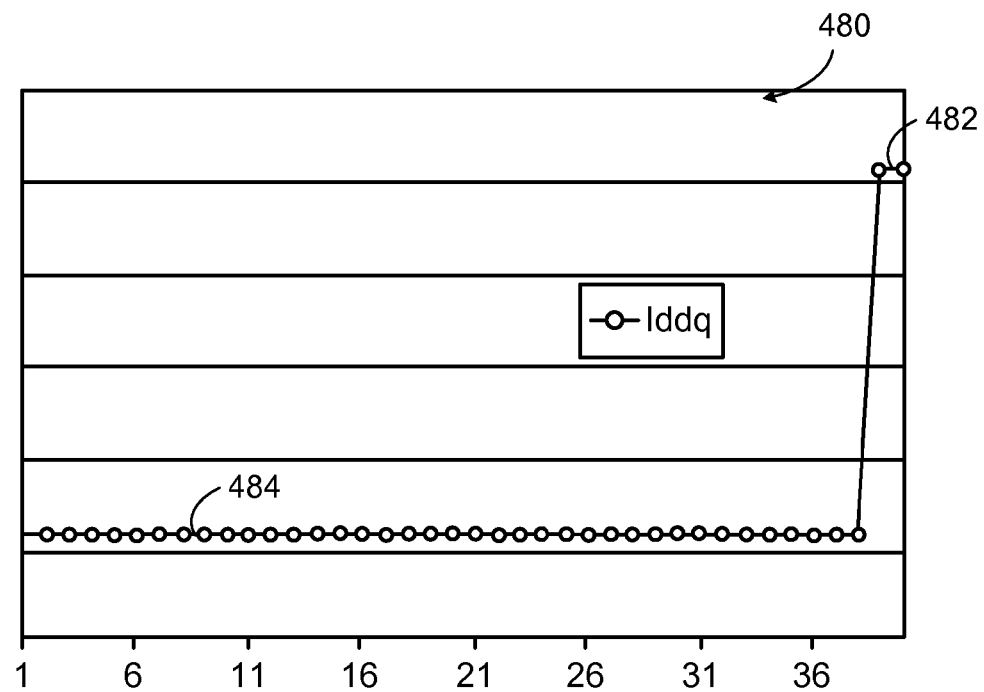

Candidate parts for $I_{DDQ}$ diagnosis were selected by inspecting $I_{DDQ}$ signatures. Two parts passing ATPG but failing delta-$I_{DDQ}$ with simple current signatures (shown in FIGS. 12A, 12B) were selected. In FIG. 12A of test results for Part A, $I_{DDQ}$ readings 470 of forty (40) $I_{DDQ}$ vectors of a specific power domain are depicted. Different levels of elevated $I_{DDQ}$ readings at 472 and 474 and 476 reflect different $I_{DDQ}$ issues or combinations of issues. Units are arbitrary. In FIG. 12B of test results for Part B, $I_{DDQ}$ readings 480 of forty (40) $I_{DDQ}$ vectors depict an elevated level at 482 for two vectors over a nominal leakage level at 484 for the other 38 vectors.

Different $I_{DDQ}$ vectors were selected to form pairs of passing and failing vectors, each pair consisting of a sample. For each sample, a pair of vectors, one passing and one failing—$V_P$ and $V_F$, (as opposed to $V_G$ and $V_B$ for $I_{DDQ}$ vector debugging)—are selected, and "bit-flipping" is performed to search for the "critical scan bit". For each tentative fixed vector $V_F(S)$ (s is the number of different scan bits replaced in $V_F$ with values in $V_P$), the vector is passed to a c-program as an application program interface (API) to the tester. The API program releases the vector, executes it, and then returns the $I_{DDQ}$ reading to indicate whether $V_B(S)$ passes or fails, and the next step of "binary search". Once all bit flipping is done for all pairs of passing/failing vectors, critical scan bits are found along with the ending passing/failing vectors that differ only by the critical scan bits. Those vectors are then simulated and the critical nets (with the opposite values in passing/failing vectors) identified for each pair. Since for each pair of ending passing/failing vectors, there is only a one scan bit difference, this ensures that the set of critical nets is minimal for each approach. For parts A and B, typically critical net sets contain anywhere from ~10 to ~1000 nets.

Figure 13:
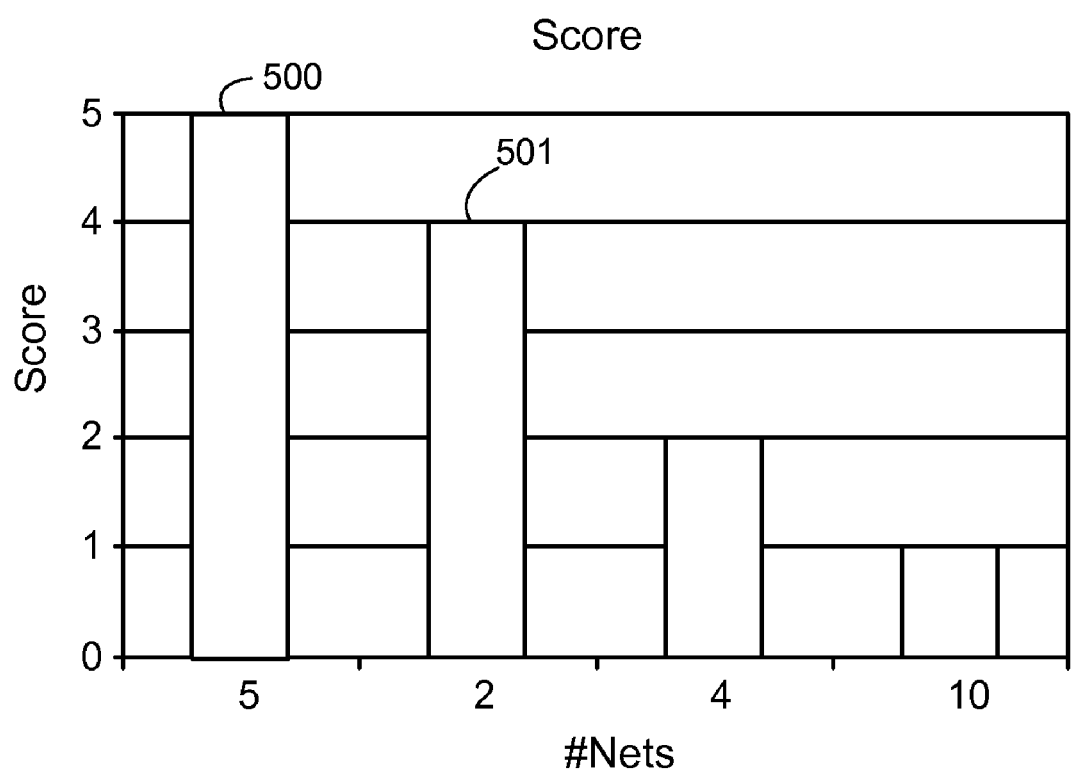
FIG. 13 illustrates a histogram plot for critical nets for five approaches or sample pairs for Part A, with thus the maximum score being depicted as five.
Figure 14:
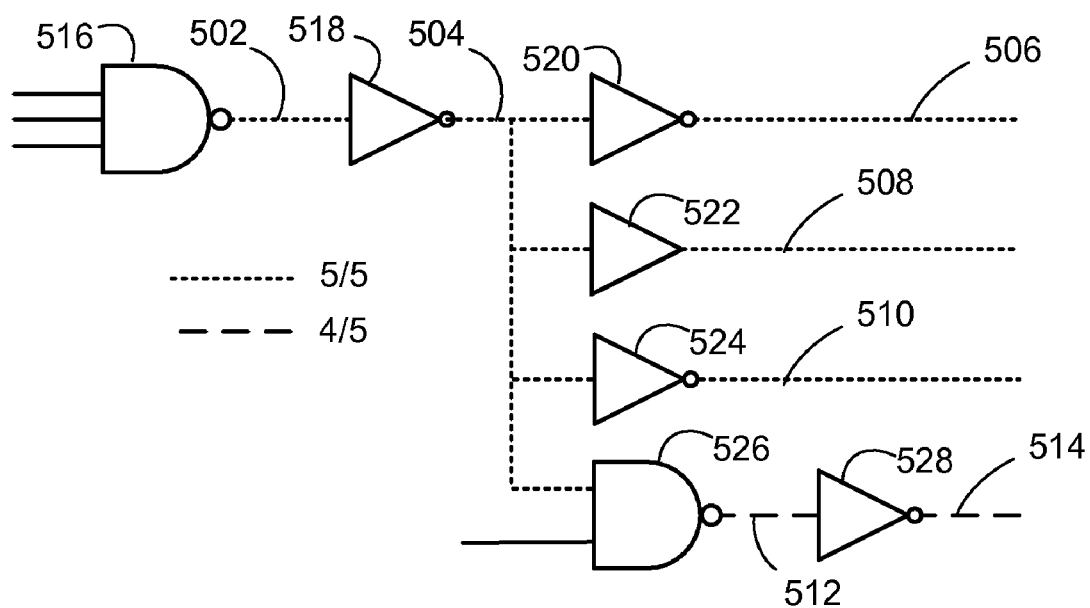
FIG. 14 illustrates critical nets with scores for Part A with five equivalent nets annotated with a score of 5/5 and two equivalent nets with a score of 4/5.

For Part A, critical net sets from five sample pairs provided an excellent diagnostic resolution, five nets got top score (5 out of 5 sample pairs) depicted at 500 and 2 nets selected by four out of the five sample pairs, as depicted at 501 in FIG. 13 in a graph 506. Analysis showed that these were two sets of logically equivalent nets, as shown in FIG. 14. In particular, five equivalent nets depicted at 502, 504, 506, 508, 510 in FIG. 14 have a score of 5/5, and two equivalent nets depicted at 512, 514 have a score of 4/5. A vector ABCD activated the nets. In particular ABC were inputs to a NAND gate 516 whose output 502 based through inverter 518 whose output 504 passed in parallel to inverter 520 having output 506, amplifier 522 having output 508, inverter 524 having output 510, and one input of a NAND 526, whose other input was vector bit D. The output 512 of the NAND 526 passed into an inverter 528 having output 514.

Figure 15:
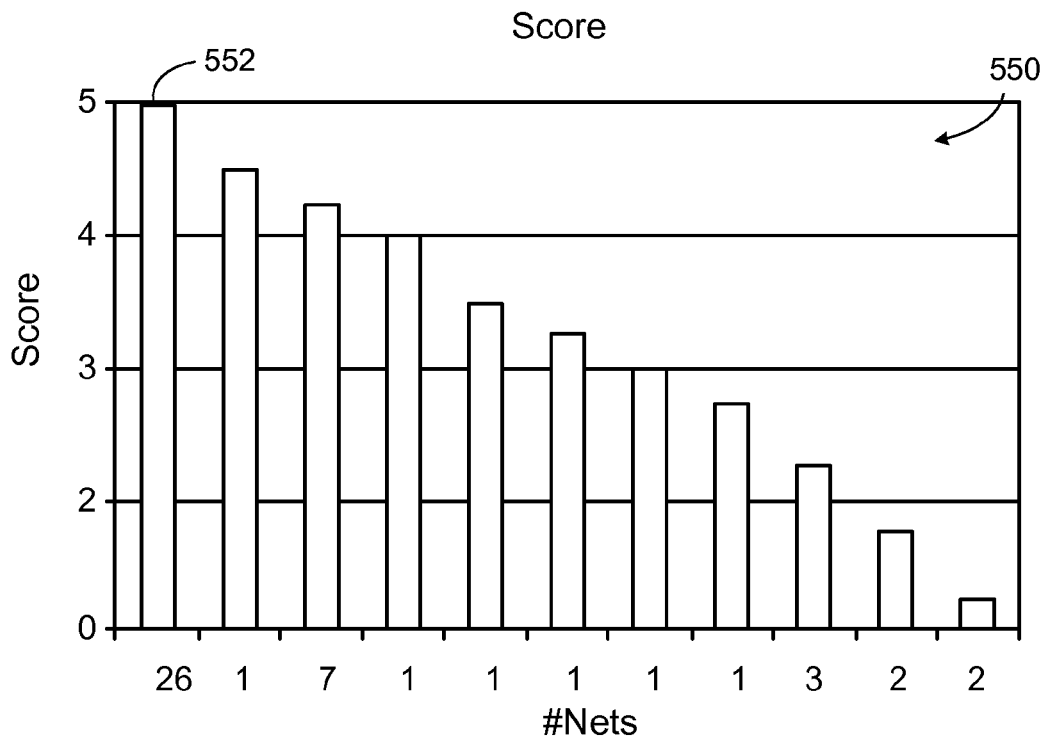
FIG. 15 illustrates a histogram plot of critical nets from sixteen approaches for Part B.
Figure 16:
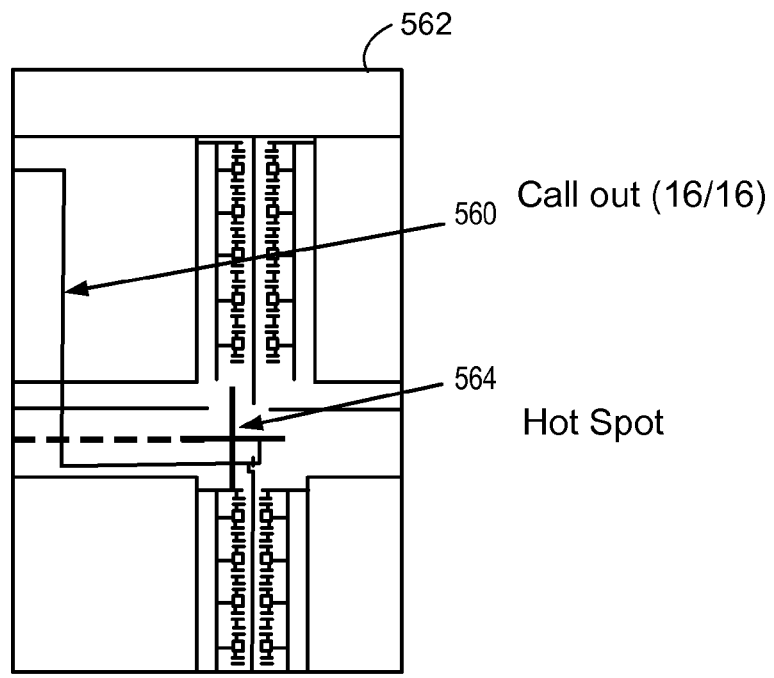
FIG. 16 illustrates a top detail view of an integrated circuit for Part B with an identified critical net call-out corresponding with an intersecting sensed hot spot.

In FIG. 15, scores are depicted for critical nets from sixteen (16) approaches 550 for part B. The twenty-six (26) nets with top score (16/16) depicted at 552 are an address bit driving sixteen (16) memory instances, including internal buffered address bit nodes, and some test points, and are all equivalent. While this information alone is exceedingly helpful in fault analysis, this call out depicted at 560 in an IC topology 562 of FIG. 16 was further correlated with an infrared (IR) hotspot 564 to narrow the location of the defect.

Figure 17:
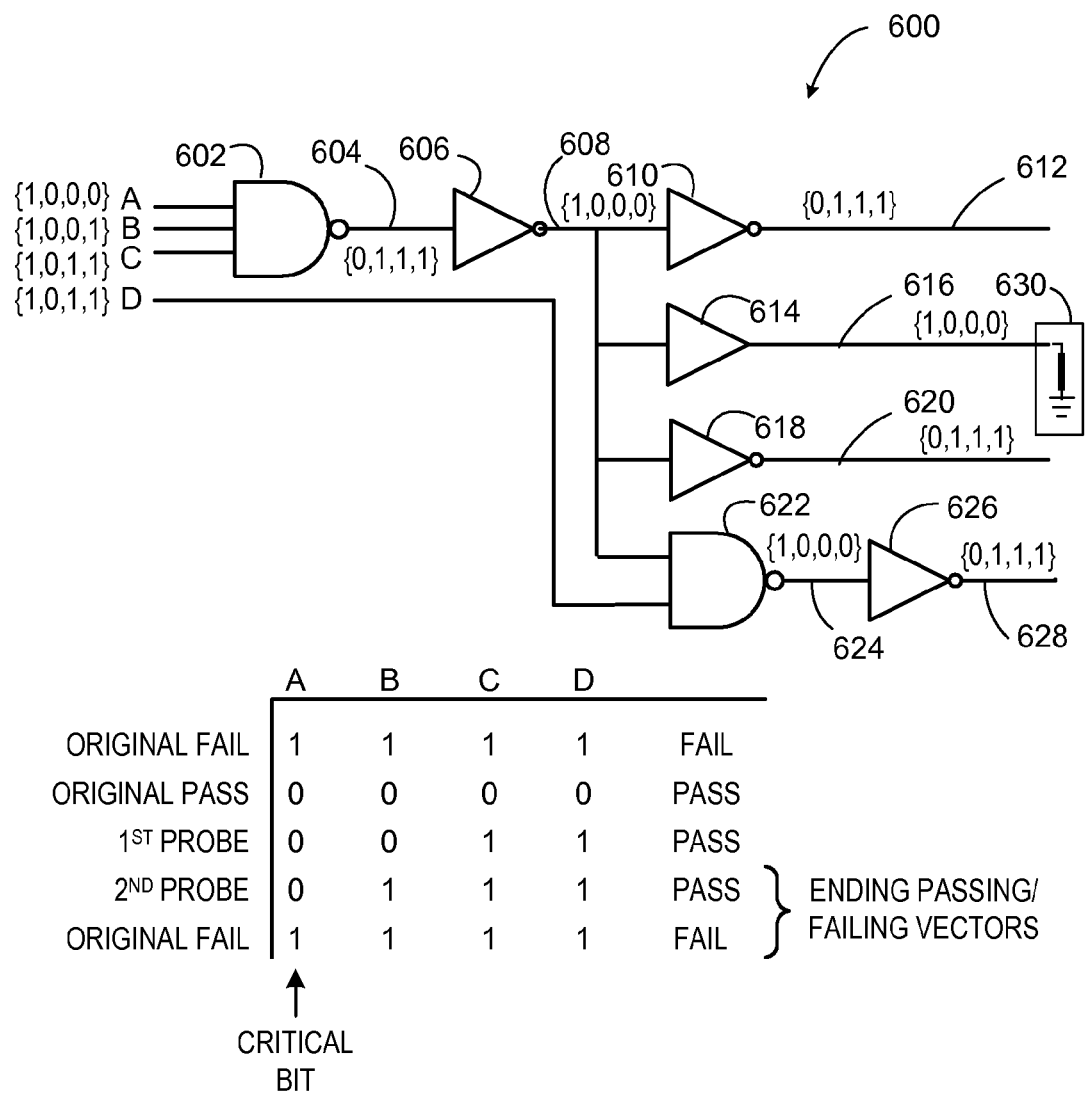
FIG. 17 illustrates a circuit being evaluated for a critical bit.

In FIG. 17, an exemplary circuit 600 is analyzed for a critical net that has a defect. A NAND gate 602 whose output 604 passes through inverter 606 whose output 608 passed in parallel to inverter 610 having output 612, amplifier 614 having output 616, inverter 618 having output 620, and one input of a NAND 622, whose other input is not defined for this analysis. An output 624 of the NAND 622 passed into an inverter 626 having output 628.

In this example, an original failing vector 1111 and a passing vector of 0000 form a sample pair. Replacing about half of the bits in the original failing vector with values from the original passing vector results in a first probe of 0011, which is a passing vector. Thus replacing a quarter toward the failing pattern (i.e., 0111) for a second probe resulted in a passing vector. Comparing this passing vector of 0111 with the original failing vector 1111 shows that the A bit is critical, which can assist in zeroing in on a defect, as depicted at 630 on output 608. The intermediate values are depicted below in Table 2, which shows that the defect 630 draws current when output 616 goes high:

TABLE 2

| ABCD vector | Description | 604 | 608 | 612 | 616 | 620 | 624 | 628 | $I_{DDQ}$ |
|---|---|---|---|---|---|---|---|---|---|
| 1111 | Original Failing | 0 | 1 | 0 | 1 | 0 | 1 | 0 | Fail |
| 0000 | Original Pass | 1 | 0 | 1 | 0 | 1 | 0 | 1 | Pass |
| 0011 | First Probe | 1 | 0 | 1 | 0 | 1 | 0 | 1 | Pass |
| 0111 | Second Probe | 1 | 0 | 1 | 0 | 1 | 0 | 1 | Pass |

Combining half of either the original passing vector or of the original failing vector with the other vector to form the first probe is illustrative as providing rapid convergence upon a critical. However, it should be appreciated with the benefit of the present disclosure that the subset combined can be approximately half rather than exactly half. Moreover, the subset could be some fraction other than a half. For example, an inference may be available that the critical bit lies within a particular subset of the vector.

Figure 18A:
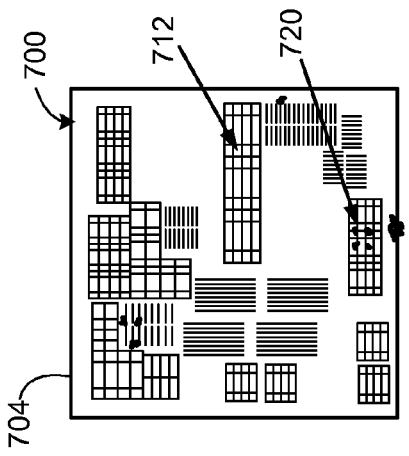
FIGS. 18A-D illustrate a top detail view of the integrated circuit for Part B taken with failing/passing vectors, in particular with FIGS. 18A-B being one sample pair with a high $I_{DDQ}$ and a low $I_{DDQ}$ respectively, and with FIGS. 18C-D being another sample pair with a high $I_{DDQ}$ and a low $I_{DDQ}$ respectively wherein a hot spot is noted having a positive correlation.
Figure 18B:
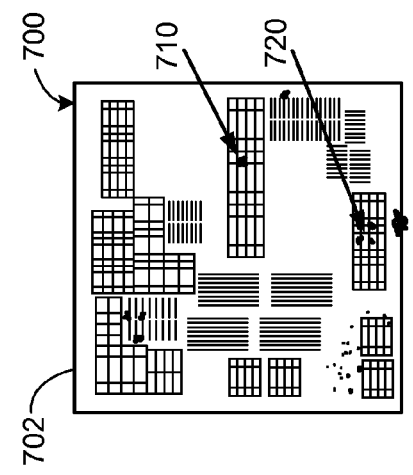
Figure 18C:
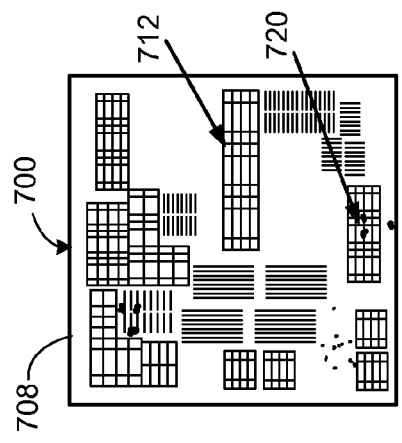
Figure 18D:
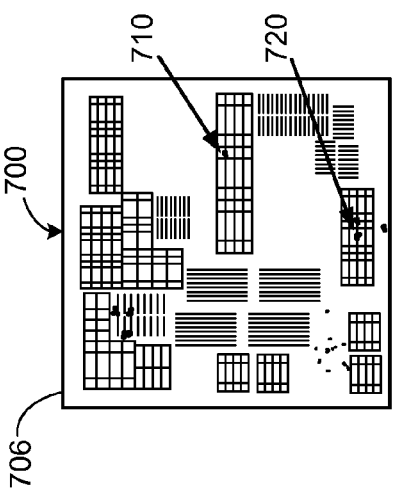

The bit-flipping approach does not only give excellent diagnostic resolution, but the ending passing/failing vector pairs which only differ by one scan bit from each other also give a way of configuring defective parts to almost identical states except for the bit that activates the defect. In FIG. 18A-18D, an IC 700 is depicted as being tested in four situations. In FIG. 18A-18B, a first sample pair is depicted respectively with an emission signature (e.g., thermal, optical, etc.) 702, 704 failing (i.e., high $I_{DDQ}$ value) and passing (i.e., low $I_{DDQ}$ value) respectively. In FIGS. 18C-18D, a second sample pair is depicted respectively as an emission signature 706, 708 respectively that are deemed failing (i.e., high $I_{DDQ}$ value) and passing (i.e., low $I_{DDQ}$ value) respectively from left to right at 706, 608. In particular, the defect activated an extra hot spot 610 that appears corresponding to elevated $I_{DDQ}$, for both failing version of sample pairs for the failing emission signatures 702, 706 in FIGS. 18A, 18C respectively. Conversely, at the same location indicated at 712 in FIGS. 17B, 17D deemed passing no hot spot is found. However, it is not legitimate to compare across different sample pairs (e.g., the emission signatures 702, 704 represented in FIGS. 18A, 18B for the first sample pair to the emission signatures 706, 708 for the other sample pair since the ending passing/failing $I_{DDQ}$ vectors for these different sample pairs are very different, and so are the corresponding emission pictures 702-708. For instance, a hot spot 620 observed in the emission signatures 702, 706 in FIGS. 18A, 18C is located in the row decoder of a memory, corresponding to the callout with top score (16/16) shown in FIG. 15.

Figure 19:
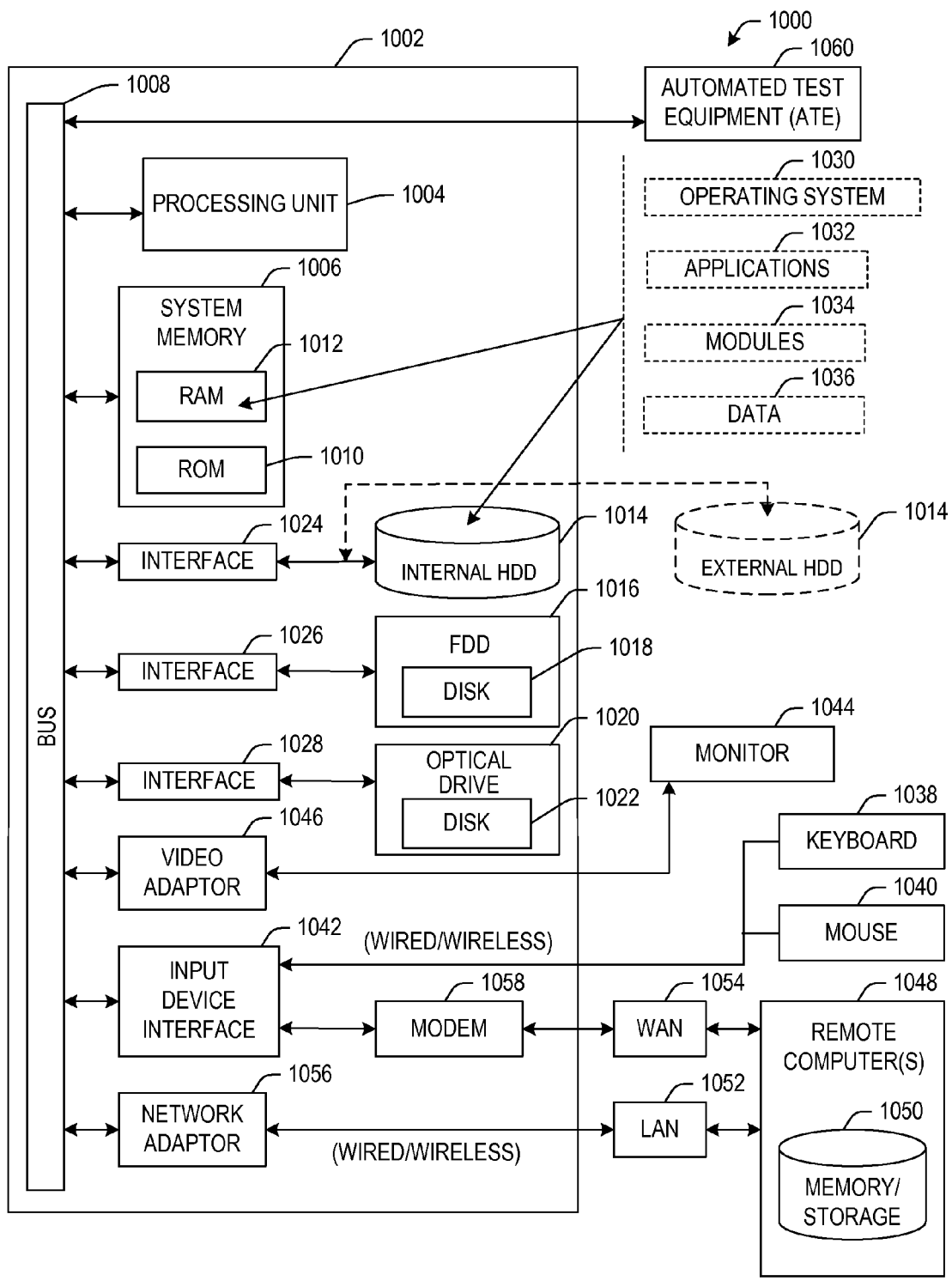
FIG. 19 illustrates a block diagram of a computer operable to execute the disclosed methodologies.

With reference to FIG. 19, the exemplary environment 1000 for implementing various aspects of the invention includes a computer 1002, the computer 1002 including a processing unit 1004, a system memory 1006 and a system bus 1008. The system bus 1008 couples system components including, but not limited to, the system memory 1006 to the processing unit 1004. The processing unit 1004 can be any of various commercially available processors. Dual microprocessors and other multi-processor architectures may also be employed as the processing unit 1004.

The system bus 1008 can be any of several types of bus structure that may further interconnect to a memory bus (with or without a memory controller), a peripheral bus, and a local bus using any of a variety of commercially available bus architectures. The system memory 1006 includes read-only memory (ROM) 1010 and random access memory (RAM) 1012. A basic input/output system (BIOS) is stored in a non-volatile memory 1010 such as ROM, EPROM, EEPROM, which BIOS contains the basic routines that help to transfer information between elements within the computer 1002, such as during start-up. The RAM 1012 can also include a high-speed RAM such as static RAM for caching data.

The computer 1002 further includes an internal hard disk drive (HDD) 1014 (e.g., EIDE, SATA), which internal hard disk drive 1014 may also be configured for external use in a suitable chassis (not shown), a magnetic floppy disk drive (FDD) 1016, (e.g., to read from or write to a removable diskette 1018) and an optical disk drive 1020, (e.g., reading a CD-ROM disk 1022 or, to read from or write to other high capacity optical media such as the DVD). The hard disk drive 1014, magnetic disk drive 1016 and optical disk drive 1020 can be connected to the system bus 1008 by a hard disk drive interface 1024, a magnetic disk drive interface 1026 and an optical drive interface 1028, respectively. The interface 1024 for external drive implementations includes at least one or both of Universal Serial Bus (USB) and IEEE 1394 interface technologies. Other external drive connection technologies are within contemplation of the subject invention.

The drives and their associated computer-readable media provide nonvolatile storage of data, data structures, computer-executable instructions, and so forth. For the computer 1002, the drives and media accommodate the storage of any data in a suitable digital format. Although the description of computer-readable media above refers to a HDD, a removable magnetic diskette, and a removable optical media such as a CD or DVD, it should be appreciated by those skilled in the art that other types of media which are readable by a computer, such as zip drives, magnetic cassettes, flash memory cards, cartridges, and the like, may also be used in the exemplary operating environment, and further, that any such media may contain computer-executable instructions for performing the methods of the invention.

A number of program modules can be stored in the drives and RAM 1012, including an operating system 1030, one or more application programs 1032, other program modules 1034 and program data 1036. All or portions of the operating system, applications, modules, and/or data can also be cached in the RAM 1012. It is appreciated that the invention can be implemented with various commercially available operating systems or combinations of operating systems.

A user can enter commands and information into the computer 1002 through one or more wired/wireless input devices, e.g., a keyboard 1038 and a pointing device, such as a mouse 1040. Other input devices (not shown) may include a microphone, an IR remote control, a joystick, a game pad, a stylus pen, touch screen, or the like. These and other input devices are often connected to the processing unit 1004 through an input device interface 1042 that is coupled to the system bus 1008, but can be connected by other interfaces, such as a parallel port, an IEEE 1394 serial port, a game port, a USB port, an IR interface, etc.

A monitor 1044 or other type of display device is also connected to the system bus 1008 via an interface, such as a video adapter 1046. In addition to the monitor 1044, a computer typically includes other peripheral output devices (not shown), such as speakers, printers, etc.

The computer 1002 may operate in a networked environment using logical connections via wired and/or wireless communications to one or more remote computers, such as a remote computer(s) 1048. The remote computer(s) 1048 can be a workstation, a server computer, a router, a personal computer, portable computer, microprocessor-based entertainment appliance, a peer device or other common network node, and typically includes many or all of the elements described relative to the computer 1002, although, for purposes of brevity, only a memory/storage device 1050 is illustrated. The logical connections depicted include wired/wireless connectivity to a local area network (LAN) 1052 and/or larger networks, e.g., a wide area network (WAN) 1054. Such LAN and WAN networking environments are commonplace in offices and companies, and facilitate enterprise-wide computer networks, such as intranets, all of which may connect to a global communications network, e.g., the Internet.

When used in a LAN networking environment, the computer 1002 is connected to the local network 1052 through a wired and/or wireless communication network interface or adapter 1056. The adaptor 1056 may facilitate wired or wireless communication to the LAN 1052, which may also include a wireless access point disposed thereon for communicating with the wireless adaptor 1056.

When used in a WAN networking environment, the computer 1002 can include a modem 1058, or is connected to a communications server on the WAN 1054, or has other means for establishing communications over the WAN 1054, such as by way of the Internet. The modem 1058, which can be internal or external and a wired or wireless device, is connected to the system bus 1008 via the serial port interface 1042. In a networked environment, program modules depicted relative to the computer 1002, or portions thereof, can be stored in the remote memory/storage device 1050. It will be appreciated that the network connections shown are exemplary and other means of establishing a communications link between the computers can be used.

The computer 1002 is operable to communicate with any wireless devices or entities operatively disposed in wireless communication, e.g., a printer, scanner, desktop and/or portable computer, portable data assistant, communications satellite, any piece of equipment or location associated with a wirelessly detectable tag (e.g., a kiosk, news stand, restroom), and telephone. This includes at least Wi-Fi and Bluetooth™ wireless technologies. Thus, the communication can be a predefined structure as with a conventional network or simply an ad hoc communication between at least two devices.

Wi-Fi, or Wireless Fidelity, allows connection to the Internet from a couch at home, a bed in a hotel room, or a conference room at work, without wires. Wi-Fi is a wireless technology similar to that used in a cellular telephone that enables such devices, e.g., computers, to send and receive data indoors and out; anywhere within the range of a base station. Wi-Fi networks use radio technologies called IEEE 802.11 (a, b, g, etc.) to provide secure, reliable, fast wireless connectivity. A Wi-Fi network can be used to connect computers to each other, to the Internet, and to wired networks (which use IEEE 802.3 or Ethernet). Wi-Fi networks operate in the unlicensed 2.4 and 5 GHz radio bands, at an 11 Mbps (802.11a) or 54 Mbps (802.11b) data rate, for example, or with products that contain both bands (dual band), so the networks can provide real-world performance similar to the basic 10BaseT wired Ethernet networks used in many offices.

The computer 1002 is advantageously interfaced to automated test equipment (ATE) 1060 that performs the $I_{DDQ}$ tests in accordance with the provided vectors and returns the measured $I_{DDQ}$ values. The computer 1002 can locally store or otherwise access leakage database and design information for pattern verification, $I_{DDQ}$ estimation, bit flipping, and the other methodologies described above.

Figure 20:
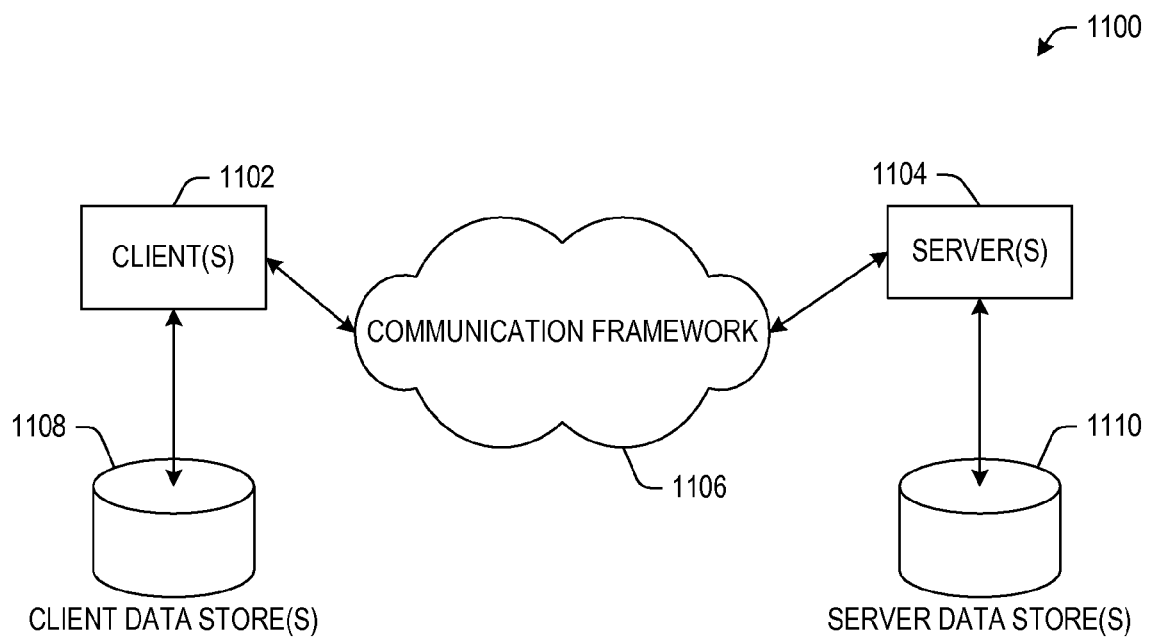
FIG. 20 illustrates a schematic block diagram of an exemplary computing environment in accordance with the subject invention.

Referring now to FIG. 20, there is illustrated a schematic block diagram of an exemplary computing environment 1100 in accordance with the subject invention. As illustrated in FIG. 20, it is to be understood that the "client(s)" can be representative of a portable device and the "server(s)" can be representative of a host computer or other disparate portable device. As shown, the system 1100 includes one or more client(s) 1102. The client(s) 1102 can be hardware and/or software (e.g., threads, processes, computing devices). The client(s) 1102 can house cookie(s) and/or associated contextual information by employing the invention, for example.

The system 1100 also includes one or more server(s) 1104. The server(s) 1104 can also be hardware and/or software (e.g., threads, processes, computing devices). The servers 1104 can house threads to perform transformations by employing the invention, for example. One possible communication between a client 1102 and a server 1104 can be in the form of a data packet adapted to be transmitted between two or more computer processes. The data packet may include a cookie and/or associated contextual information, for example. The system 1100 includes a communication framework 1106 (e.g., a global communication network such as the Internet) that can be employed to facilitate communications between the client(s) 1102 and the server(s) 1104.

Communications can be facilitated via a wired (including optical fiber) and/or wireless technology. The client(s) 1102 are operatively connected to one or more client data store(s) 1108 that can be employed to store information local to the client(s) 1102 (e.g., cookie(s) and/or associated contextual information). Similarly, the server(s) 1104 are operatively connected to one or more server data store(s) 1110 that can be employed to store information local to the servers 1104.

It should be appreciated that a semiconductor manufacturing with a silicon substrates has been described herein as an illustrative implementation. However, aspects consistent with the present disclosure have application to other semiconductors such as gallium arsenide.

In view of the exemplary systems described supra, methodologies that may be implemented in accordance with the disclosed subject matter have been described with reference to several flow diagrams. While for purposes of simplicity of explanation, the methodologies are shown and described as a series of blocks, it is to be understood and appreciated that the claimed subject matter is not limited by the order of the blocks, as some blocks may occur in different orders or concurrently with other blocks from what is depicted and described herein. Moreover, not all illustrated blocks may be required to implement the methodologies described herein. Additionally, it should be further appreciated that the methodologies disclosed herein are capable of being stored on an article of manufacture to facilitate transporting and transferring such methodologies to computers. The term article of manufacture, as used herein, is intended to encompass a computer program accessible from any computer-readable device, carrier, or media.

It should be appreciated that any patent, publication, or other disclosure material, in whole or in part, that is said to be incorporated by reference herein is incorporated herein only to the extent that the incorporated material does not conflict with existing definitions, statements, or other disclosure material set forth in this disclosure. As such, and to the extent necessary, the disclosure as explicitly set forth herein supercedes any conflicting material incorporated herein by reference. Any material, or portion thereof, that is said to be incorporated by reference herein, but which conflicts with existing definitions, statements, or other disclosure material set forth herein, will only be incorporated to the extent that no conflict arises between that incorporated material and the existing disclosure material.

What is claimed is:

1. A method for detecting defects in an integrated circuit with quiescent supply current ($I_{DDQ}$) testing, comprising:
   sensing a state of a plurality of addressable components respectively, of a low power semi-conductor integrated circuit;
   testing the plurality of addressable components with a plurality of vectors, at least one vector causing a quiescent supply current level, the at least one vector being defined as a failing vector if the quiescent supply current level is above a desired level, otherwise the at least one vector being defined as a passing vector;
   forming a sample pair of a failing vector and a passing vector from the plurality of vectors; and iteratively forming a probe vector as a combination of the failing vector and passing vector with additional subsets from a failing vector of a previously formed passing probe vector or additional subsets from a passing vector of a previously formed failing probe vector to converge upon a final sample pair differing by a critical bit whose state directly correlates with either a passing or failing result.

2. The method of claim 1, further comprising testing the plurality of addressable components with a plurality of binary vectors.

3. The method of claim 1, wherein the plurality of addressable components comprises a plurality of registers, the method further comprising configuring the low power semiconductor integrated circuit into a functional mode.

4. The method of claim 1, wherein the plurality of addressable components comprises a plurality of scan cells, the method further comprising configuring the low power semiconductor integrated circuit into a test mode.

5. The method of claim 1, wherein an iteratively reduced subset comprises a fraction of bits of a previous iteration to converge upon the critical bit.

6. The method of claim 5, wherein the iteratively reduced subset comprises about one half of the bits of a previous iteration.

7. The method of claim 1, further comprising:
sensing an emission signal from the integrated circuit; and
correlating a hot spot that appears and disappears in accordance with the critical bit to identify a defect physical location.

8. The method of claim 7, further comprising sensing a thermal signal emitted from the integrated circuit.

9. The method of claim 7, further comprising sensing an optical signal emitted from the integrated circuit.

10. The method of claim 1, further comprising:
identifying a missing constraint in response to diagnosing that a condition can occur if an identified addressable component is not constrained to a fixed low power state; and
selecting a new plurality of vectors incorporating the constraint.

11. The method of claim 10, wherein the identified addressable component is a selected one of a group consisting of integrated circuit cores, modules, blocks, and circuitry.

12. The method of claim 1, further comprising detecting a single issue as a subset of $I_{DDQ}$ readings at a first elevated level.

13. The method of claim 1, further comprising detecting multiple issues as a first subset of $I_{DDQ}$ readings at a first elevated level and a second subset of $I_{DDQ}$ readings at a second elevated level and subsequent subset of $I_{DDQ}$ readings at a subsequent elevated levels.

14. The method of claim 1, further comprising:
accessing a design configuration database to identify module information for the integrated circuit and collapse or breakdown the design into the constituent modules;
accessing a library database for quiescent supply current leakage estimated values for each module of the integrated circuit; and
totaling the $I_{DDQ}$ module estimate to estimate total $I_{DDQ}$ for a selected vector.

15. The method of claim 1, further comprising:
identifying an inaccurate library database for quiescent supply current leakage estimates in response to an elevated reading for all vectors of the $I_{DDQ}$ test;
developing a higher resolution simulation for custom circuitry; and
updating the library database estimates.

16. At least one processor for detecting defects in an integrated circuit with quiescent supply current ($I_{DDQ}$) testing, comprising:
a first module for sensing a state of a plurality of addressable components respectively, of a low power semiconductor integrated circuit;
a second module for testing the plurality of addressable components with a plurality of vectors, at least one vector causing a quiescent supply current level, the at least one vector being defined as a failing vector if the quiescent supply current level is above a desired level, otherwise the at least one vector being defined as a passing vector;
a third module for forming a sample pair of a failing vector and a passing vector from the plurality of vectors; and
a fourth module for iteratively forming a probe vector as a combination of the failing vector and passing vector with additional subsets from a failing vector of a previously formed passing probe vector or additional subsets from a passing vector of a previously formed failing probe vector to converge upon a final sample pair differing by a critical bit whose state directly correlates with either a passing or failing result.

17. The at least one processor of claim 16, the second module for testing the plurality of addressable components with a plurality of binary vectors.

18. The at least one processor of claim 16, wherein the plurality of addressable components comprises a plurality of registers, the at least one processor further comprising a module for configuring the low power semiconductor integrated circuit into a functional mode.

19. The at least one processor of claim 16, wherein the plurality of addressable components comprises a plurality of scan cells, the at least one processor further comprising a module for configuring the low power semiconductor integrated circuit into a test mode.

20. The at least one processor of claim 16, wherein the fourth module iteratively reduces a subset comprising a fraction of bits of a previous iteration to converge upon the critical bit.

21. The at least one processor of claim 20, wherein the fourth module iteratively reduces a subset of about one half of the bits of a previous iteration.

22. The at least one processor of claim 16, further comprising:
a fifth module for sensing an emission signal from the integrated circuit; and
a sixth module for correlating a hot spot that appears and disappears in accordance with the critical bit to identify a defect physical location.

23. The at least one processor of claim 22, the fifth module for sensing a thermal signal emitted from the integrated circuit.

24. The at least one processor of claim 22, the fifth module for sensing an optical signal emitted from the integrated circuit.

25. The at least one processor of claim 16, further comprising:
a fifth module for identifying a missing constraint in response to diagnosing that a condition can occur if an identified addressable component is not constrained to a fixed low power state; and
the second module for selecting a new plurality of vectors incorporating the constraint.

26. The at least one processor of claim 25, the second module for sensing the identified addressable component as a selected one of a group consisting of integrated circuit cores, modules, blocks, and circuitry.

27. The at least one processor of claim 16, the third module for detecting a single issue as a subset of $I_{DDQ}$ readings at a first elevated level.

28. The at least one processor of claim 16, the third module for detecting multiple issues as a first subset of $I_{DDQ}$ readings at a first elevated level and a second subset of $I_{DDQ}$ readings at a second elevated level and subsequent subset of $I_{DDQ}$ readings at a subsequent elevated levels.

29. The at least one processor of claim 16, further comprising:
- a module for accessing a design configuration database to identify module information for the integrated circuit and collapse or breakdown the design into the constituent modules;
- a module for accessing a library database for quiescent supply current leakage estimated values for each module of the integrated circuit; and
- a module for totaling the $I_{DDQ}$ module estimate to estimate total $I_{DDQ}$ for a selected vector.

30. The at least one processor of claim 16, further comprising:
- a module for identifying an inaccurate library database for quiescent supply current leakage estimates in response to an elevated reading for all vectors of the $I_{DDQ}$ test;
- a module for developing a higher resolution simulation for custom circuitry; and
- a module for updating the library database estimates.

31. A computer program product comprising a computer-readable medium for detecting defects in an integrated circuit with quiescent supply current ($I_{DDQ}$) testing, comprising:
- a computer-readable program embodied in said readable medium, comprising:
  - a first set of codes for causing a computer to sense a state of a plurality of addressable components respectively, of a low power semiconductor integrated circuit;
  - a second set of codes for causing the computer to test the plurality of addressable components with a plurality of vectors, at least one vector causing a quiescent supply current level, the at least one vector being defined as a failing vector if the quiescent supply current level is above a desired level, otherwise the at least one vector being defined as a passing vector;
  - a third set of codes for causing the computer to form a sample pair of a failing vector and a passing vector from the plurality of vectors; and
  - a fourth set of codes for causing the computer to iteratively form a probe vector as a combination of the failing vector and passing vector with additional subsets from a failing vector of a previously formed passing probe vector or additional subsets from a passing vector of a previously formed failing probe vector to converge upon a final sample pair differing by a critical bit whose state directly correlates with either a passing or failing result.

32. The computer program product of claim 31, the second set of codes for causing the computer to test the plurality of addressable components with a plurality of binary vectors.

33. The computer program product of claim 31, wherein the plurality of addressable components comprises a plurality of registers, the computer program product further comprising a set of codes for causing the computer to configure the low power semiconductor integrated circuit into a functional mode.

34. The computer program product of claim 31, wherein the plurality of addressable components comprises a plurality of scan cells, the computer program product further comprising a set of codes for causing the computer to configure the low power semiconductor integrated circuit into a test mode.

35. The computer program product of claim 31, the fourth set of codes for causing the computer to generate an iteratively reduced subset of a fraction of bits of a previous iteration to converge upon the critical bit.

36. The computer program product of claim 35, the fourth set of codes for causing the computer to form the iteratively reduced subset of about one half of the bits of a previous iteration.

37. The computer program product of claim 31, further comprising:
- a fifth set of codes for causing the computer to sense an emission signal from the integrated circuit; and
- a sixth set of codes for causing the computer to correlate a hot spot that appears and disappears in accordance with the critical bit to identify a defect physical location.

38. The computer program product of claim 37, the fifth set of codes for causing the computer to sense a thermal signal emitted from the integrated circuit.

39. The computer program product of claim 37, the fifth set of codes for causing the computer to sense an optical signal emitted from the integrated circuit.

40. The computer program product of claim 31, further comprising:
- a fifth set of codes for causing the computer to identify a missing constraint in response to diagnosing that a condition can occur if an identified addressable component is not constrained to a fixed low power state; and
- the second set of codes for causing the computer to select a new plurality of vectors incorporating the constraint.

41. The computer program product of claim 40, the second set of codes for causing the computer to sense the identified addressable component as a selected one of a group consisting of integrated circuit cores, modules, blocks, and circuitry.

42. The computer program product of claim 31, the third set of codes for causing the computer to detect a single issue as a subset of $I_{DDQ}$ readings at a first elevated level.

43. The computer program product of claim 31, the third set of codes for causing the computer to detect multiple issues as a first subset of $I_{DDQ}$ readings at a first elevated level and a second subset of $I_{DDQ}$ readings at a second elevated level and subsequent subset of $I_{DDQ}$ readings at a subsequent elevated levels.

44. The computer program product of claim 31, further comprising:
- a set of codes for causing the computer to access a design configuration database to identify module information for the integrated circuit and collapse or breakdown the design into the constituent modules;
- a set of codes for causing the computer to access a library database for quiescent supply current leakage estimated values for each module of the integrated circuit; and
- a set of codes for causing the computer to total the $I_{DDQ}$ module estimate to estimate total $I_{DDQ}$ for a selected vector.

45. The computer program product of claim 31, further comprising:
- a set of codes for causing the computer to identify an inaccurate library database for quiescent supply current leakage estimates in response to an elevated reading for all vectors of the $I_{DDQ}$ test;
- a set of codes for causing the computer to develop a higher resolution simulation for custom circuitry; and
- a set of codes for causing the computer to update the library database estimates.

46. An apparatus for detecting defects in an integrated circuit with quiescent supply current ($I_{DDQ}$) testing, comprising:
- means for sensing a state of a plurality of addressable components respectively, of a low power semiconductor integrated circuit;
- means for testing the plurality of addressable components with a plurality of vectors, at least one vector causing a quiescent supply current level, the at least one vector being defined as a failing vector if the quiescent supply current level is above a desired level, otherwise the at least one vector being defined as a passing vector;
- means for forming a sample pair of a failing vector and a passing vector from the plurality of vectors; and
- means for iteratively forming a probe vector as a combination of the failing vector and passing vector with additional subsets from a failing vector of a previously formed passing probe vector or additional subsets from a passing vector of a previously formed failing probe vector to converge upon a final sample pair differing by a critical bit whose state directly correlates with either a passing or failing result.

47. The apparatus of claim 46, further comprising means for testing the plurality of addressable components with a plurality of binary vectors.

48. The apparatus of claim 46, wherein the plurality of addressable components comprises a plurality of registers, the apparatus further comprising means for configuring the low power semiconductor integrated circuit into a functional mode.

49. The apparatus of claim 46, wherein the plurality of addressable components comprises a plurality of scan cells, the apparatus further comprising means for configuring the low power semiconductor integrated circuit into a test mode.

50. The apparatus of claim 46, wherein an iteratively reduced subset comprises a fraction of bits of a previous iteration to converge upon the critical bit.

51. The apparatus of claim 50, wherein the iteratively reduced subset comprises about one half of the bits of a previous iteration.

52. The apparatus of claim 46, further comprising:
- means for sensing an emission signal from the integrated circuit; and
- means for correlating a hot spot that appears and disappears in accordance with the critical bit to identify a defect physical location.

53. The apparatus of claim 52, further comprising means for sensing a thermal signal emitted from the integrated circuit.

54. The apparatus of claim 52, further comprising means for sensing an optical signal emitted from the integrated circuit.

55. The apparatus of claim 46, further comprising:
- means for identifying a missing constraint in response to diagnosing that a condition can occur if an identified addressable component is not constrained to a fixed low power state; and
- means for selecting a new plurality of vectors incorporating the constraint.

56. The apparatus of claim 55, wherein the identified addressable component is a selected one of a group consisting of integrated circuit cores, modules, blocks, and circuitry.

57. The apparatus of claim 46, further comprising means for detecting a single issue as a subset of $I_{DDQ}$ readings at a first elevated level.

58. The apparatus of claim 46, further comprising means for detecting multiple issues as a first subset of $I_{DDQ}$ readings at a first elevated level and a second subset of $I_{DDQ}$ readings at a second elevated level and subsequent subset of $I_{DDQ}$ readings at a subsequent elevated levels.

59. The apparatus of claim 46, further comprising:
- means for accessing a design configuration database to identify module information for the integrated circuit and collapse or breakdown the design into the constituent modules;
- means for accessing a library database for quiescent supply current leakage estimated values for each module of the integrated circuit; and
- means for totaling the $I_{DDQ}$ module estimate to estimate total $I_{DDQ}$ for a selected vector.

60. The apparatus of claim 46, further comprising:
- means for identifying an inaccurate library database for quiescent supply current leakage estimates in response to an elevated reading for all vectors of the $I_{DDQ}$ test;
- means for developing a higher resolution simulation for custom circuitry; and
- means for updating the library database estimates.

61. An apparatus for detecting defects in an integrated circuit with quiescent supply current ($I_{DDQ}$) testing, comprising:
- a virtual tester for sensing a state of a plurality of addressable components respectively, of a low power semiconductor integrated circuit and testing the plurality addressable components with a plurality of vectors, at least one vector causing a quiescent supply current level, the at least one vector being defined as a failing vector if the quiescent supply current level is above a desired level, otherwise the at least one vector being defined as a passing vector; and
- an $I_{DDQ}$ vector analyzer for generating the plurality of vectors for the virtual tester, for forming a sample pair of a failing vector and a passing vector from the plurality of vectors, and for iteratively forming a probe vector as a combination of any failing vector and any passing vector with additional subsets from a failing vector of a previously formed passing probe vector or additional subsets from a passing vector of a previously formed failing probe vector to converge upon a final sample pair differing by a critical bit whose state directly correlates with either a passing or failing result.

62. The apparatus of claim 61, further comprising the virtual tester testing the plurality of addressable components with a plurality of binary vectors.

63. The apparatus of claim 61, wherein the tester accesses in a functional mode the plurality of addressable components comprising a plurality of registers.

64. The apparatus of claim 61, wherein the tester accesses in a test mode the plurality of addressable components comprising a plurality of scan cells.

65. The apparatus of claim 61, wherein the $I_{DDQ}$ vector analyzer iteratively reduces a subset comprising a fraction of a number of bits of a previous iteration to converge upon the critical bit.

66. The apparatus of claim 65, wherein the iteratively reduced subset comprises about one half of the bits of a previous iteration.

67. The apparatus of claim 61, further comprising an emission sensor for sensing an emission signal from the integrated circuit that the $I_{DDQ}$ vector analyzer correlates with the critical bit.

68. The apparatus of claim 67, wherein the emission sensor comprises a thermal sensor.

69. The apparatus of claim 67, wherein the emission sensor comprises an optical sensor.

70. The apparatus of claim 61, further comprising the $I_{DDQ}$ vector analyzer identifying a missing constraint in response to diagnosing that a condition can occur if an identified addressable component is not constrained to a fixed low power state, and selecting a new plurality of vectors incorporating the constraint.

71. The apparatus of claim 70, wherein the identified component is a selected one of a group consisting of integrated circuit cores, modules, blocks, and circuitry.

72. The apparatus of claim 61, further comprising the $I_{DDQ}$ vector analyzer detecting a single issue as a subset of $I_{DDQ}$ readings at a first elevated level.

73. The apparatus of claim 72, further comprising the $I_{DDQ}$ vector analyzer detecting multiple issues as a first subset of $I_{DDQ}$ readings at a first elevated level and a second subset of $I_{DDQ}$ readings at a second elevated level.

74. The apparatus of claim 61, further comprising the $I_{DDQ}$ vector analyzer accessing a design configuration database to identify module information for the integrated circuit and collapse or breakdown the design into the constituent modules, accessing a library database for quiescent supply current leakage estimated values for each module of the integrated circuit, and totaling the $I_{DDQ}$ module estimate to estimate total $I_{DDQ}$ for a selected vector.

75. The apparatus of claim 61, further comprising the $I_{DDQ}$ vector analyzer identifying an inaccurate library database for quiescent supply current leakage estimates in response to an elevated reading for all vectors of the $I_{DDQ}$ test, developing a higher resolution simulation for custom circuitry, and updating the library database estimates.

* * * * *